United States Patent [19]
Krishnamoorthy et al.

[11] Patent Number: 5,412,592
[45] Date of Patent: May 2, 1995

[54] OPTOELECTRONIC ASSOCIATIVE MEMORY USING PARALLEL-READOUT OPTICAL DISK STORAGE

[75] Inventors: Ashok V. Krishnamoorthy, San Diego; Philippe J. Marchand, San Clemente; Gokce Yayla, San Diego; Sadik C. Esener, Solana Beach, all of Calif.

[73] Assignee: The Regents of the University of California, Oakland, Calif.

[21] Appl. No.: 785,408

[22] Filed: Oct. 31, 1991

[51] Int. Cl.⁶ .............................................. G11C 15/00
[52] U.S. Cl. ...................................... 365/49; 369/103; 369/124
[58] Field of Search ................. 365/49, 215; 369/103, 369/109, 112, 120, 124, 50; 377/102; 359/3, 10, 22; 382/50

[56] References Cited

U.S. PATENT DOCUMENTS 4,084,260 4/1978 Fleming et al. ..................... 365/49
5,131,055 7/1992 Chao ................................... 365/49

*Primary Examiner*—Eugene R. LaRoche
*Assistant Examiner*—Andrew Tran
*Attorney, Agent, or Firm*—Fuess, Davidenas & Meadows

[57] ABSTRACT

A high capacity (1 Gbyte), high throughput (1.1 Gbyte/s) motionless-head parallel-readout optical disk, and a detector array integrated on substrate with an Si/PLZT Exclusive-NOR gate array, implement a fast retrieval (25 ms) associative memory/content addressable memory capable of $10^{10}$ bit-operations per second. The disk stores arrayed 1-D holograms, preferably computer-generated from $128 \times 128$ pixel images by Fourier transform. Reverse transform upon disk readout is by lenses, preferably by a single hybrid refractive/diffractive lens. The reconstituted 2-D image, or optical word, is detected and compared to an electrical data word in an fast integrated optoelectronic circuit. The circuit permits (i) a variably preset "match" detection threshold, and (ii) dynamically variable, sub-image, field size of the search. In a first mode of operation all images (or sub-images) that are sufficiently close to a preset query threshold are retrieved in one disk rotation. In a second mode, Hamming distances for all images (sub-images) are calculated during a first disk rotation, and the identified best match(es) is (are) retrieved on a subsequent rotation. In a third mode a query image can be classified relative to all images upon a disk during one rotation of the disk. In still other modes the associative memory can search for images and sub-images (optical words) of variable size in parallel.

41 Claims, 39 Drawing Sheets

|  | Diffraction effiency | Worst case contrast ratio | Average contrast ratio |
|---|---|---|---|
| Cell Oriented | 7 % | < 1 | 10 |
| Error Diffusion | 5 % | 2 | 15 |
| FFT Grey level 4x1 | 5 % | 5 | 25 |
| Iterative Grey level 4x1 | 12 % | 50 | 350 |

Figure 7

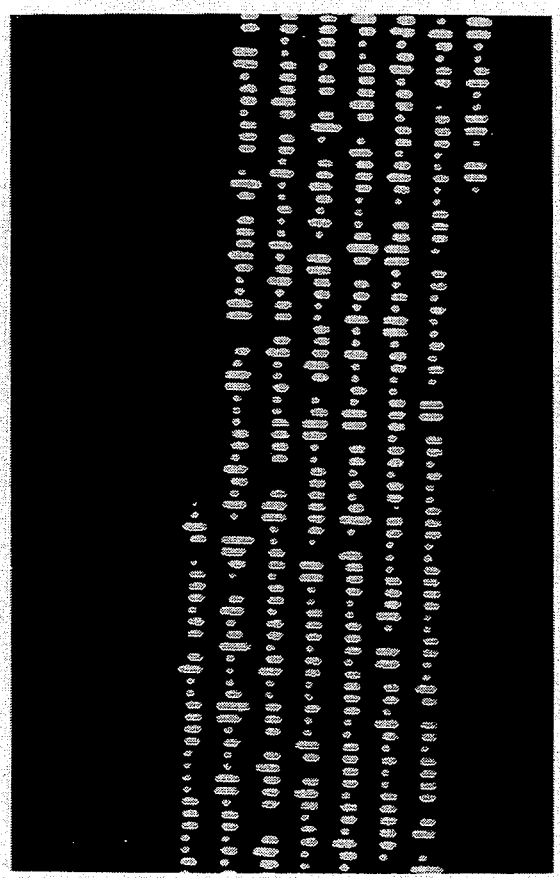 
Radial Direction
Figure 8

Bit sequence to be detected 1100011
Average SNR 40

2 lens system: Fourier transform along Y,
Imaging along X with magnification d2/d1

Single element system: Fourier transform along Y,
Imaging along X with magnification M = f'y / d'

|              | 2 lenses | OCDL      | Hybrid lens |
|--------------|----------|-----------|-------------|
| Error        | 15800    | 950       | 193         |
| Total length | 216 mm   | 295.4 mm  | 330.6 mm    |

Figure 12

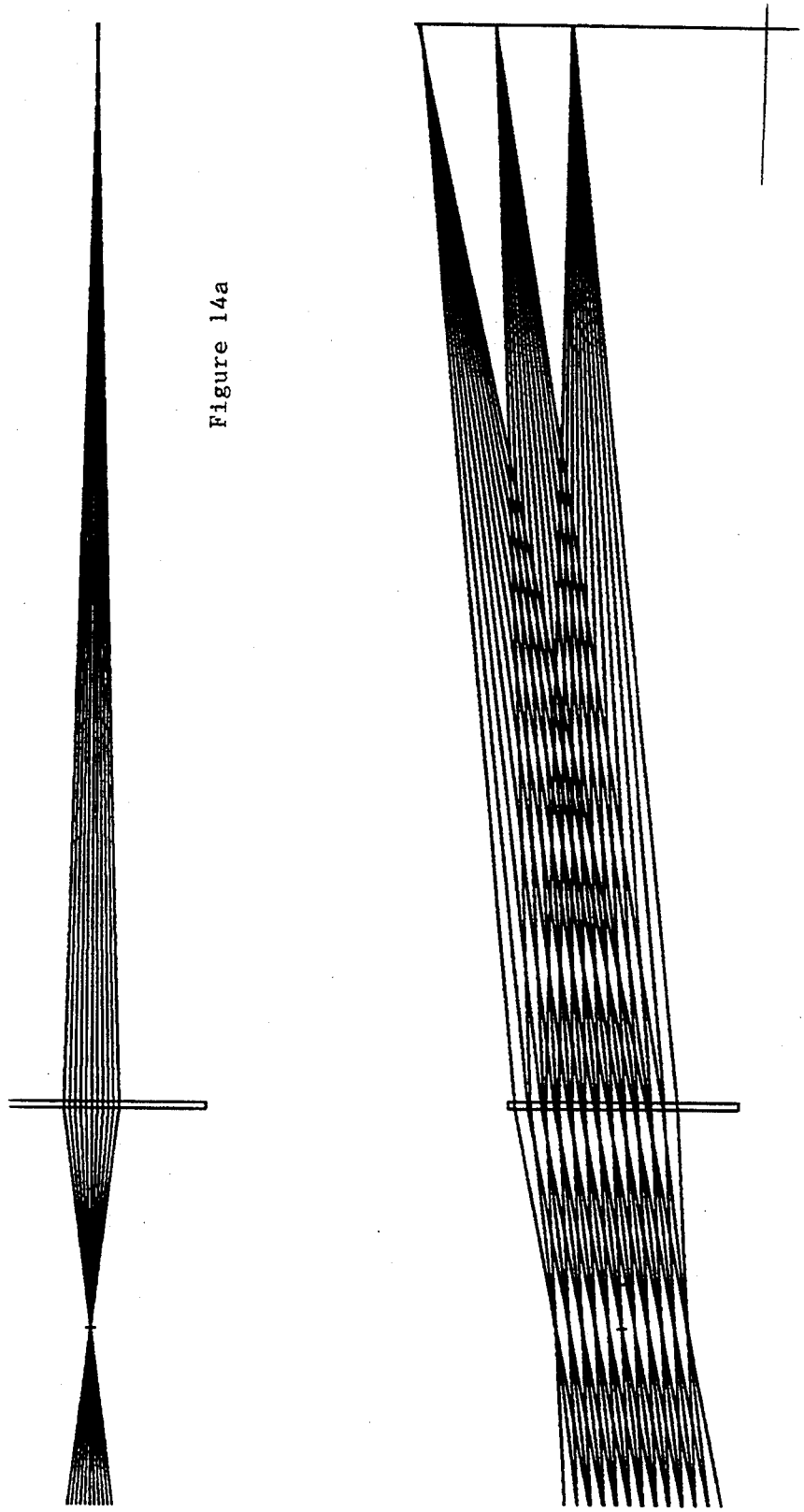

|  | VOLUME HOLOGRAMS | UCI/UCSD 3-D MEMORIES | POHM | UCSD PARALLEL OPTICAL DISK |
|---|---|---|---|---|
| CAPACITY | 125 GBytes | 12.5 GBytes | 725 MBytes | 940 MBytes |
| DATA RATE | 12.5 TByte/sec | 12.5 TByte/sec | 0.1 GByte/sec | 1.2 GByte/sec |
| LATENCY TIME | 10 sec | 1 µsec | 0.1 msec | 1.7 µsec |
| RETRIEVAL TIME | 10 msec | 1 msec | 0.5 sec | 25 msec |
| DESCRIPTION | LiNbO$_3$, 10x10x1 cm$^3$ 10$^3$ pages @ 10$^9$ bits/page | 10x10x1 cm$^3$ 10$^3$ pages @ 10$^8$ bits/page | 6x6 inches card 5800 pages @ 10$^6$ bits/page | 5 1/4" disks @ 2400 rpm 14500 pages @ 128x128 bits/page |

FIGURE 25

| | STORAGE REQUIREMENTS | SEARCH TIME | SYSTEM REQUIREMENTS | FAULT TOLERANCE |
|---|---|---|---|---|
| OTHER PRODUCT NEUTRAL NETWORK ARCHITECTURE | $N^2$<br>$M < 0.15N$<br>Analog weights | $O\left[\text{Log}\left(\frac{N}{M}\right)\right]$ | $N^2$ - element matrix-tensor multiplications | Graceful degradation to:<br>Local memory damage<br>Memory overloading |
| PARALLEL INNER PRODUCT NEUTRAL NETWORK ARCHITECTURE | $MN + M \log M$<br>binary weights | $O[\text{Log } M]$ | $M$ ($N$-element) matrix-matrix comparisons<br>+ maximum selection circuit | - No tolerance to Memory damage<br>- Upper limit on number of stored memories |
| SERIAL INNER PRODUCT PAGE SERIAL BIT PARALLEL COMPARISON | $MN$<br>binary weights | $O[\text{Log } M]$ | $N$-element matrix-matrix comparisons | Fault tolerance can be traded in for capacity |

*N = NUMBER OF BITS PER MEMORY PAGE
M = NUMBER OF MEMORY PAGES

FIGURE 26

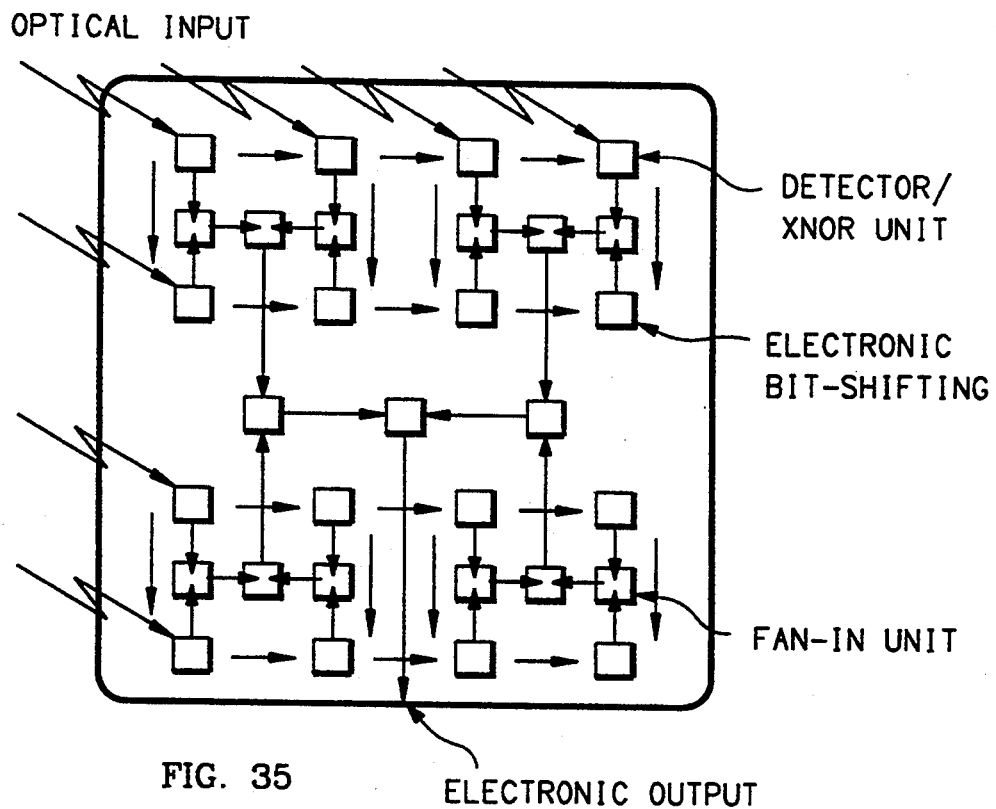
FIG. 35
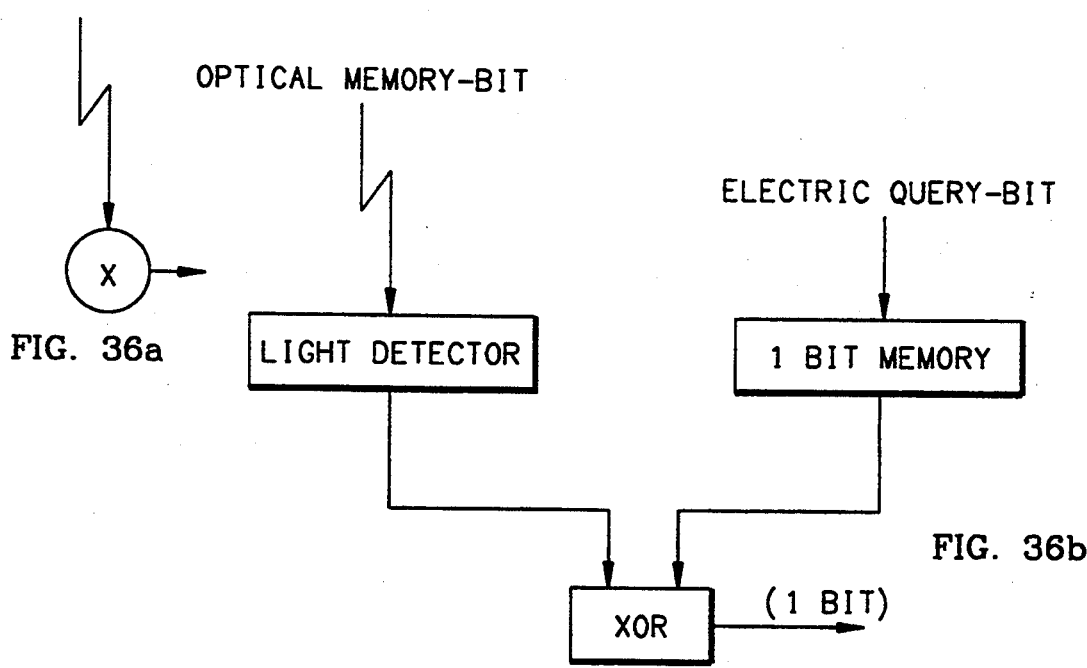
FIG. 36a
FIG. 36b bits/line in brackets

Level of node in italics

OPTOELECTRONIC ASSOCIATIVE MEMORY USING PARALLEL-READOUT OPTICAL DISK STORAGE

This invention was made by support of the U.S. Government under Contract No. RADC-30602-89-C-10145 acting through the United States Air Force, Rome Air Development Center (RADC). The U.S. Government has certain rights in this invention.

REFERENCE TO RELATED PATENT APPLICATIONS

The present patent application is related to U.S. patent application Ser. No. 785,742 filed on an even date herewith for a MOTIONLESS PARALLEL READOUT HEAD FOR AN OPTICAL DISK RECORDED WITH ARRAYED ONE-DIMENSIONAL HOLOGRAMS to Philippe J. Marchand, Ashok V. Krishnamoorthy, Pierre Ambs, Sadik C. Esener, and Sing H. Lee.

BACKGROUND OF THE INVENTION

1. Field of the Invention

The present invention generally pertains to associative, or content addressable, memories. The present invention particularly pertains to associative memories having optical storage, and still more particularly to such memories having (i) optical disk storage and (ii) a combined electrical and optical detection and comparison function.

2. Background of the Invention

There has been considerable interest over the past two decades in the ability to achieve recall of an item stored in a memory device based on a partial query, namely an Associative Memory. Reference, for example, T. Kuhonen, *Self Organization and Associative Memory*, Springer Verlag, 1984. One distinguishing characteristic of an Associative Memory is its ability to recall the correct output pattern even when the input is distorted or incomplete. Associative Memories are also "robust" in the sense that information is stored in a distributed, redundant manner, and that the system degrades gracefully when too many patterns are stored in the memory, or when too much noise is introduced in the input query.

A Content Addressable Memory (CAM) is a special form of an Associative Memory. A CAM produces the address of the desired output pattern when an input is presented. If used in conjunction with a conventional memory device, this system also achieves associative recall, but without the robustness of a distributed storage medium. If used in conjunction with a "holographic" storage device, then this system achieves all of the distinguishing properties of a true associative memory as mentioned above.

The associative memory is a sort of "holy grail" of machine intelligence. It is not a conventional memory. It is rather a memory producing an output that is "associated" with an input—sort of like the human mind. For example, if a digitalized pattern of the spoken word "giraffe" is input to an associative memory containing a vocabulary of such words then the memory will output a signal that effectively says "I detect this word to have been "giraffe" (as opposed to "x-ray", or "orange")". For example, if a digitalized picture of a giraffe is input to an associative memory than the memory might produce a signal that says "I detect this picture to have been of a giraffe" as opposed to a "dog" or a "bird".

This function is exceedingly useful. Hence the interest in associative memories.

The key performance measures for a hardware implementation of an associative memory (or a CAM) are its capacity (number of stored bits) and its search rate (bit-operations/sec). In general, both the capacity and the search rate are limited by the particular technology used for storage/processing and by the choice of algorithm.

For purely electronic Associative Memory (or CAM) implementations, there exists a trade-off between the storage capacity and the maximum search rate. While high speed, pipelined VLSI chips (109 bit-ops/sec) have been demonstrated their capacity is severely limited (10–20 Kbit) since all memory resides on-chip. Reference T. Ogura, J. Yamada, S. Yamada, and M. Tan-no, "A 20-Kbit Associative Memory LSI for Artificial Intelligence Machines," *IEEE Journal of Solid State Circuits*, Vol. 24, No. 4, August, 1989; H. Takata, S. Komori, T. Tamura, F. Asai, H. Satoh, T. Ohno, T. Tokuda, H. Nishikawa, and H. Terada, "A 100 Mega-access per Second Matching Memory for a data driven microprocessor," *IEEE Journal of Solid State Circuits*, Vol. 25, No. 1, February, 1990; and H. Bergh, J. Eneland, and L. Lundstrom, "A Fault Tolerant Associative Memory with High Speed Operation," IEEE Journal of Solid State Circuits, Vol. 25, No. 4, August, 1990.

Current high-capacity off-line storage systems have low transfer rates relative to these processing speeds. Reference B. Robinson. "Grand challenge to Supercomputing", *Electron. Eng. Times*, Vol. 18, September, 1989. For instance, solid-state disk drives, with capacities of 100 Mbytes, can provide data rates on the order of 10 Mbytes/sec. Reference L. Curran. "Wafer scale integration arrives in disk form", *Electron. Design.*, Vol. 26, October 1989.

Projected development in main memory technologies such as SRAM and DRAM could provide a data transfer bandwidth of 100Mbytes/sec. Reference H. E. Maes et al. "Trends in semiconductor memories", *Microelectronics* Vol. 20, pp 9–57, 1989. However, their capacity will remain severely limited (1–10 Mbytes). Reference S. Hunter, F. Kiamilev, S. C. Esener, D. A. Parthenopoulos, and P. M. Rentzepis, "Potentials of two-photon based 3-D memories for high performance computing," *Appl. Opt.* Vol. 29, pp 2058–2066, May, 1990.

The limited storage capacity of semiconductor memories combined with the limited pin-out available on the VLSI chip creates a performance bottleneck for associative memory applications since the serial (or semi-parallel) I/O subsystem forces the processing units to wait for new data.

SUMMARY OF THE INVENTION

The present invention contemplates an optoelectronic associative memory system that typically advances each of (i) a data transfer bandwidth at which binary words (images) are retrieved by greater than two orders of magnitude ($>10^2$); (ii) the storage capacity of the binary words (images) on which associative comparisons are performed by greater than several orders of magnitude ($>10^3$); and (iii) the bit-operations per second of its associative determinations by greater than two orders of magnitude ($>10^2$), over previous, semiconductor-based, associative memories. The associative memory system in accordance with the present invention uses (i) a new parallel-accessed optical memory and (ii) a new custom-designed Opto-Electronic Integrated Circuit (OEIC) that accepts both optical and electrical input data in order to make an associative comparison.

Nonetheless to being new, each of the parallel-accessed optical memory and the OEIC are implemented with existing, low-risk, technologies. The parallel-accessed optical memory is based on existing optical Compact Disk (CD) technology. The OEIC is an efficient combination of light detectors and logic circuitry on the same silicon substrate. Because the associative memory system of the present invention is implementable with present technology, its two-plus-orders-of-magnitude performance advantages are immediately available. The concepts of the system are, however, applicable to even larger and faster optical memories than a CD—including three-dimensional optical memories—and to larger and faster OEIC's.

In its preferred embodiment the optoelectronic associative memory includes an optical store producing an optically-encoded first word, or image, having a multiplicity of bits encoded in parallel upon a light beam. This optical store is preferably a parallel-readout optical disk.

The parallel-optically-encoded light beam is detected in arrayed light detectors that operate in parallel to produce a number of first electrical signals corresponding to the parallel-encoded bits in the optically-encoded first word (image). Meanwhile, an electrical device, typically (but not necessarily) an external computer or electrical memory, produces a second, query, word, or image, having a number of bits electrically-encoded as a number of second electrical signals.

In accordance with the present invention, the first and the second electrical signals are compared, normally in comparison circuitry including XNOR gates and adders, in order to determine the correspondence between the optically-encoded first word (image) and the electrically-encoded second, query, word (image). The comparison circuitry is preferably located on the same physical substrate as the light detectors, forming thereby an optoelectronic integrated circuit.

The comparison circuitry typically organized as a binary tree proceeding in pipelined stages from leaf node detectors to a root node where a final determination of a match/mismatch, or of the Hamming distance of separation between the compared words (images), is made. The second, query, word (image) is typically held constant while a great number of first words (images) successively retrieved from the optical store are successively compared. Because the optically-encoded first words (images) are typically retrieved at a high data transfer bandwidth, normally one 16,384-bit word (one 128×128 pixel bit image) 560,000 times a second (1.1 Mbyte bandwidth), and because the pipelined architecture of the optoelectronic integrated circuit permits both the (i) quick detection and (ii) quick comparison of the retrieved first words (images) to the query second word (image), the effective bit-operations, or bit-comparisons, per second is very high, and is typically better than $10^{10}$. Meanwhile the capacity of the data store relative to which the comparisons are made—which data store is typically located on one or more optical disks—is essentially unlimited because many optical disks may be read in a "jukebox" fashion while each such disk typically contains $2.29376 \times 10^8$ bits, or 14,000 words of 16,384 bits per word (14,000 128×128 pixel images).

The preferred optoelectronic integrated circuit may operate to compare sub-words (sub-images) of each word (image) retrieved from the optical data store. This operation both (i) identifies if any portions of a word (image) compare to a search criteria, and (ii) locates all such portions.

The preferred embodiment of the associative memory has at least three different operational modes. In a first mode a threshold value of comparison is preselected. All words or sub-words (images or sub-images) that are sufficiently close to the query are retrieved, normally to a host computer, via the photodetector array.

A second mode finds the best match to the query word (image). On the first rotation, the Hamming distance detected for each word (image) is input to the decision circuit (normally in a page-serial bit-parallel search). The best match is identified and retrieved on a subsequent interrogation of the optical memory store (rotation of the optical disk). The associative memory can also be reconfigured to perform associative search for images of variable sizes while retaining the parallelism and high data rate provided by the optical storage medium.

The third mode of operation permits the associative memory system to be used as a classifier in pattern recognition applications. A query image, or sub-image, is compared to all images stored on the optical disk. If a "match" within a particular Hamming distance of separation is found then the query belongs to that particular class.

These and other aspects and attributes of the present invention will become increasingly clear upon reference to the following drawings and accompanying specification.

BRIEF DESCRIPTION OF THE DRAWINGS

FIG. 7 is a Table 1 showing a comparison of encoding methods for 1-D holograms.

FIG. 8 is a plate, corresponding to an actual microphotograph, of 1-D holograms according to the formats, and in the layouts, of FIGS. 1, 2, and 5 recorded on an E-beam test plate (not an optical disk, but equivalent thereto) using the identical 1 μm pit size and 1.5 μm pitch as is used upon the optical disks that produce the images of FIGS. 10 and 16.

FIG. 12 is a Table 2 showing the results of a comparison of three different output lenses systems usable within the motionless parallel readout head.

FIG. 14 is a diagram of the a ray tracing of a computerized analysis of a that embodiment of a motionless parallel readout head using two orthogonal cylindrical diffractive lenses, which embodiment is within the Table 2 of FIG. 12.

FIG. 25 is a Table 3 showing the variation in critical parameters for different optical, parallel-access, storage media.

FIG. 26 is a Table 4 showing a comparison of associative memory algorithms.

FIG. 35 is a diagrammatic representation, equivalent to FIG. 23a at an expanded scale, of the optoelectronic integrated circuit used in the associative memory in accordance with the present invention.

FIG. 36, consisting of FIG. 36a and FIG. 36b, is a diagram of a symbol, and of a flow diagram, for the function of a leaf node optical detector and XNOR gate used in the optoelectronic integrated circuit used in the associative memory in accordance with the present invention.

DESCRIPTION OF THE PREFERRED EMBODIMENT

Figure 1:
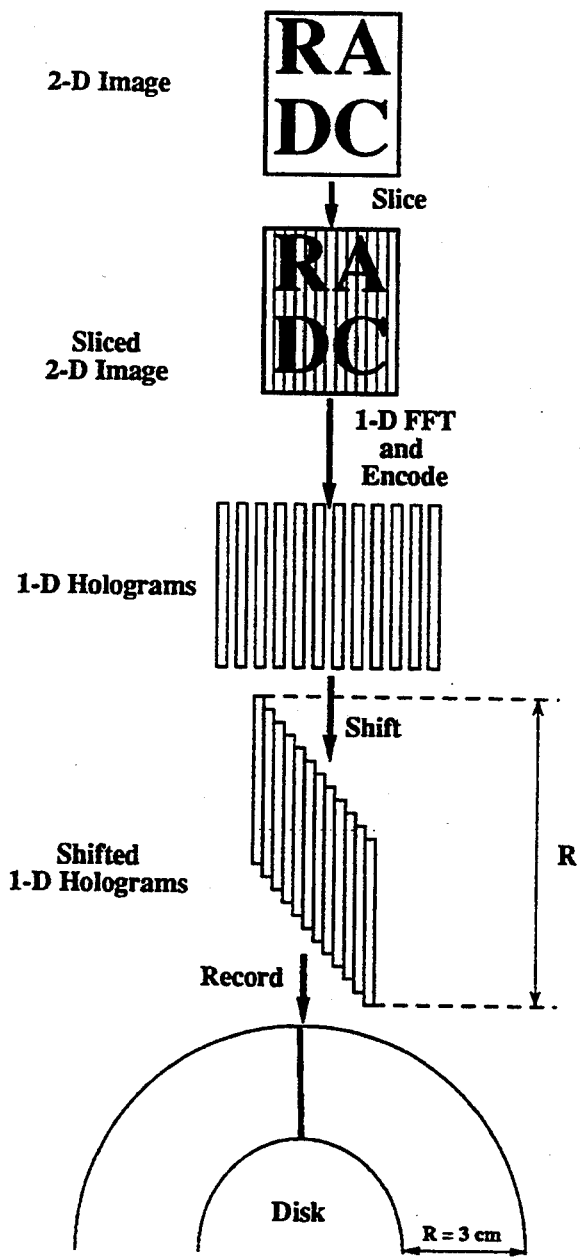
FIG. 1 is a diagrammatic representation of a method of encoding data onto an optical disk by the steps of (i) digitalizing a 2-D image, (ii) slicing the 2-D image into 1-D columns, (iii) Fourier transforming, and encoding each of the 1-D columns to produce a corresponding 1-D hologram, (iv) shifting the 1-D holograms so that a shifted plurality of such fit the radius of an optical disk, and (v) recording the 1-D holograms along a one radius (of many such) upon an optical disk.

The present invention of a Associative memory uses, as one of its main components, a parallel readout system for optical disk. The following Section 1 discusses the parallel optical readout system for optical disk used within the Associative memory of the present invention. Section 1 also discusses a preferred disk data encoding method with which the parallel optical readout system is operative, and a preferred optical readout lens system. The associative memory application of such a parallel optical readout system for optical disk is described in section 2. Another major component of the Associative memory of the present invention—an optoelectronic integrated circuit—is described in Section 3. A discussion of the importance of the present invention is contained in Section 4.

1. Motionless parallel readout system for optical disk

The parallel optical disk readout system used in the Associative memory of the present invention is expounded in greater detail in the companion patent application U.S. Ser. No. 785,742 filed on an even date herewith for an MOTIONLESS PARALLEL READOUT HEAD FOR AN OPTICAL DISK RECORDED WITH ARRAYED ONE-DIMENSIONAL HOLOGRAMS to inventors Philippe J. Marchand, Ashok V. Krishnamoorthy, Pierre Ambs, Kristopher Urquhart, Sadik C. Esener, and Sing H. Lee. The contents of the related patent application are incorporated herein by reference.

The preferred embodiment of the parallel optical disk readout system has a data transfer rate, or bandwidth, of 1.1 Gbyte/sec and an average access time of 12.5 msec. The preexisting data accessed by the readout is written radially on the disk as arrayed one-dimensional (1-D) holograms. Data access is achieved solely through the disk rotation. These characteristics admirably support the voluminous data storage, and the high data transfer bandwidth, requirements of an Associative memory.

The parallel optical disk readout system used in the Associative memory of the present invention has as one of its advantages that absolutely no mechanical motion of the optical readout "head" is required for either access, focusing or tracking. The head is absolutely motionless.

1.1 Disk encoding

The readout system is operative on a broad range of optical disks and optical technologies. It may be, for example, used with an industry standard Compact Disk Read Only Memory (CD ROM) of 5 ¼" diameter with a 1.5 μm track pitch and a 1 μm pit size. The disk's active surface has a radius of 3 cm, and therefore contains 20,000 concentric tracks. The disk has a capacity of 940 Mbytes.

The preferred data encoding method with which the readout system is operative is arbitrarily parameterized so as to permit reconstructions (output) of 128×128 pixel bit images at a high signal to noise ratio (SNR) of 60 Db. This high SNR effectively means that the image data, or "word", that is recorded is the exact same image data, or "word", that is retrieved, and that there is insignificant read error. The SNR is readily adjustable both upwards—at the expense of recording density—and downwards—to the benefit of recording density—as is desired, all in a manner hereinafter explained.

As illustrated in FIG. 1, the data blocks are 1-D Fourier transform Computer Generated Holograms (CGH) each of which is calculated to reconstruct one column of 128 pixels. One hundred and twenty-eight (128) of these blocks (1-D holograms), representing one image (or word) of 128×128 pixels (16,384 bits), are distributed along the radial direction of the disk's active surface, and are shifted radially from one another to fit a complete radius. Successive radial arrays of 128 blocks, or 1-D holograms, each are themselves displaced laterally one from the next, and are arrayed circumferentially around the annular surface of the disk. A disk encoded in this way has a capacity of approximately 14,000 radial arrays, each of which contains one 128×128 pixel bit image, or one 16,384 bit word.

Figures 2A, 2B:
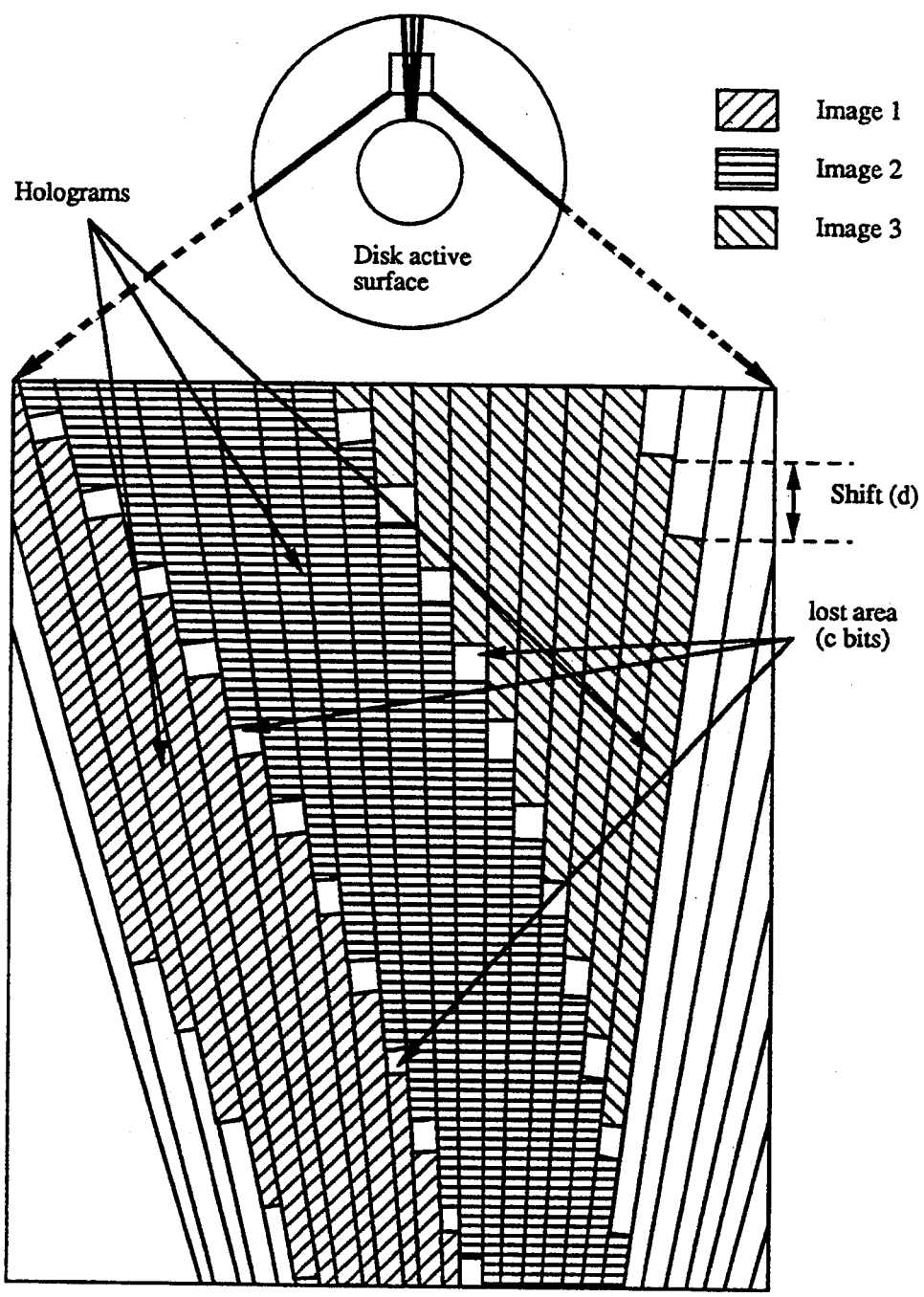
FIG. 2 is a diagrammatic representation, partially at an expanded scale, of the data layout on an optical disk recorded by the method illustrated in FIG. 1, which data layout includes plural data images each consisting of a number of radially-arrayed 1-D holograms which holograms are laterally shifted relative to one another within each data image, and which arrays of 1-D holograms are circumferentially shifted one array to the next circumferentially around the optical disk.

Successive 2-D images are encoded and recorded along subsequent radial lines of the disk, as shown in FIG. 2. Conventional E-beam lithography may be used, as is discussed in greater detail hereinafter, to fabricate such an optical disk having the indicated layout of the holograms.

1.2 Optical readout system

Figure 3:
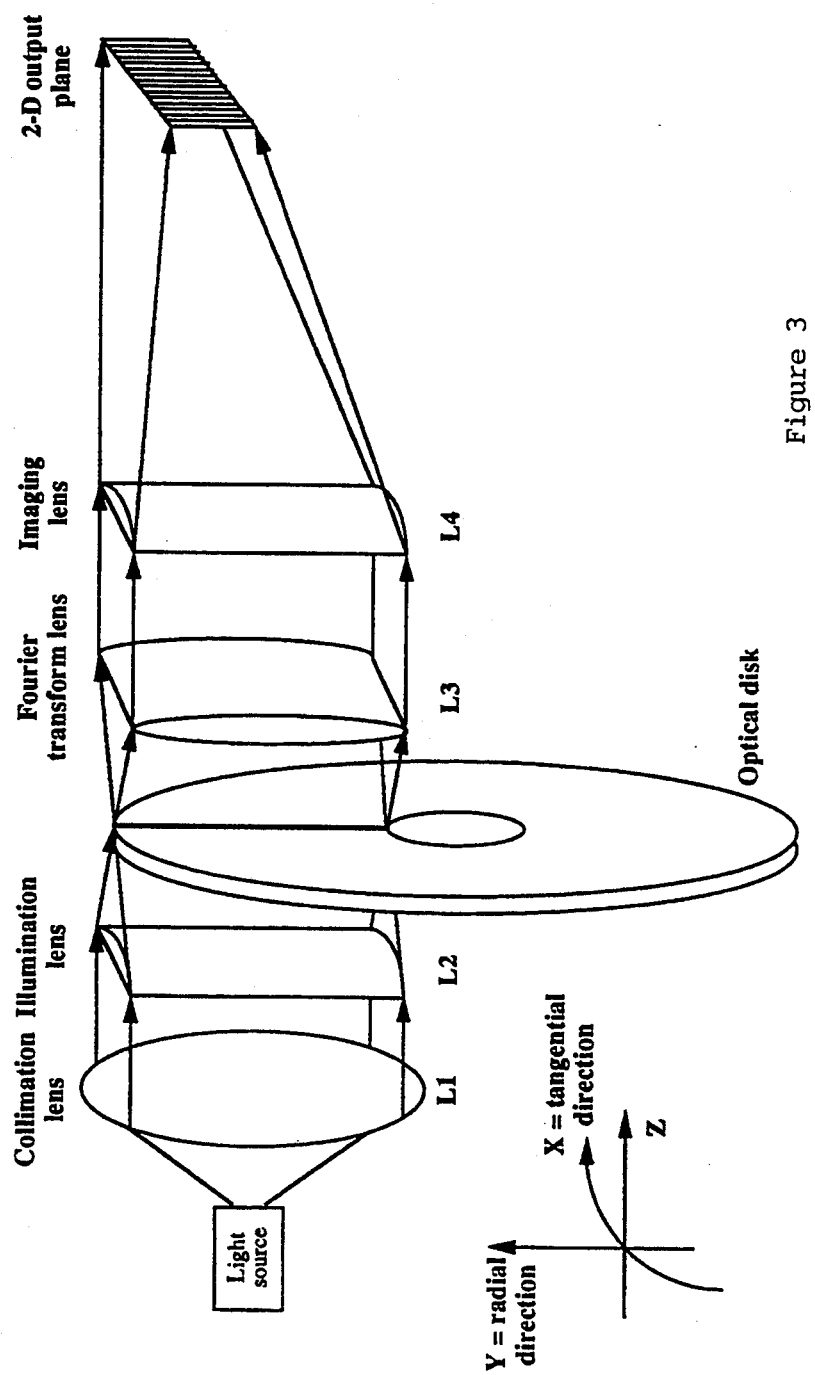
FIG. 3 is an optical schematic diagram of one embodiment of a motionless parallel readout head for an optical disk recorded with arrayed one-dimensional holograms, which embodiment uses two orthogonal cylindrical refractive lenses in the output imaging and transforming.

One preferred embodiment of an optical readout system is shown in diagrammatic form in FIG. 3. The system serves to map the 1-D data distribution on the disk to a 2-D image at the output.

The particular embodiment shown in FIG. 3 makes use of a refractive optical system, namely the two orthogonal cylindrical lenses L3 and L4, for parallel readout of the disk. Other optical systems, including a preferred system using a Hybrid refractive/diffractive Optical Lens (HOL) are possible, and are discussed hereinafter. The optical system of FIG. 3 is exemplary in the following explanation of the principles of the parallel readout head for an optical disk, but should not be held to be limiting of the possible types of such a parallel readout head.

A monochromatic, spatially coherent (laser) light source is collimated by lens L1 and focussed to a nearly radial line on the disk by a slightly rotated cylindrical lens L2. The radial line illuminated by Lens L2 is normally equal in length to the entire radius of the annulus of the disk's active surface. Therefore 128 data blocks, or 1-D holograms, are illuminated simultaneously (reference FIG. 2). This single set of one-dimensional (1-D) holograms that is illuminated at one time is sufficient to reconstruct one complete two-dimensional (2-D) image.

Following the disk in the optical path from the Light source to the Output plane are two orthogonal cylindrical lenses L3, L4. The first lens Fourier transforms the holograms arrayed along the radial (vertical) direction. The second cylindrical lens L4, images, and typically also magnifies, the holograms in the tangential (horizontal) direction onto the Output plane. Both the cylindrical lenses L3, L4 have as their focal planes the Output plane. The result of the imaging and transformation produced by both lenses L3, L4 is that the individual Fourier hologram reconstructions appear in the first diffraction order above the axis, imaged side by side. In the preferred parameterization, a full 128 1-D holographic data blocks are read simultaneously, permitting reconstruction of a binary image of 128×128 pixels on the output plane.

As the disk spins, successive radial lines of 1-D holograms are illuminated. The result is that the output image on the Output plane changes corresponding to the recorded information. Thus, all information stored on the disk can be retrieved in one single rotation of the disk while the "head", or all lenses, remains motionless. Due to the shift-invariance and information redundancy properties of the Fourier transform, there is no need for tracking or focussing mechanisms.

Because no mechanical motion of the head is required to access any image stored on the disk, the entire contents of the disk can be retrieved in one rotation of the disk. A high data transfer bandwidth can accordingly be achieved. For a preferred nominal disk rotation speed of 2,400 rpm, the data retrieval (transfer) rate, or bandwidth, is then 1.1 Gbytes/sec. The average image, or word, access time is 12.5 msec, and the maximum retrieval time is 25 msec.

The beam illuminating the disk and its arrayed holograms converges along the tangential direction, and is a plane wave along the radial direction. The preferred width of the area containing the data blocks of one image is 22 $\mu$m. A relatively large f-number lens (L1) is used to ensure a small illumination solid angle Therefore, the depth of focus is large ($> \pm 10$ $\mu$m). This Lens L1 is placed out of focus, and at a distance calculated to allow the illuminating beam to be slightly smaller than 22 $\mu$m at the disk plane. A wobble of up to 20 $\mu$m due to flatness variations of the spinning surface can therefore be tolerated.

In addition, due to the hologram information redundancy, even partially illuminated holograms permit reconstruction of the entire data. For example, a severe loss of as much as 10% of the hologram information induces a reduction of only 3 Db in the reconstruction Signal to Noise Ratio (SNR). Reference K. Kubota, et al., "Holographic disk with high data transfer rate," *Appl. Opt.* 19, pp 944–951, March, 1980.

For these reasons, no focusing servo is required.

Moreover, no tracking servo is required either. As discussed in the previous section 1.1, the data on the disk is encoded as 1-D computer generated Fourier holograms. Because Fourier-transform holograms are shift-invariant, the eccentricity (radial motion) of the spinning disk does not affect the reconstruction of the data. Therefore no tracking servo is required.

Additional embodiments of the optical readout system, which embodiments particularly employ different lenses to perform the Fourier transformation and the imaging and magnifying functions, will be further discussed in section 1.6 hereinafter. For the moment, however, it is useful to understand more about the nature of the 1-D holograms that the motionless readout head serves to read.

1.3 Two Preferred Methods of Hologram encoding

The manner, and the parameterization, of the holographic data encoding on the disk are key factors in the optimal operation of the parallel readout system. The quality of the image reconstruction, and also the size of the hologram (and therefore also the capacity of the disk), both depend on the holographic encoding.

The motionless parallel readout head will work with 1-D holograms constructed by many different algorithms. However, more cleverly constructed holograms promote better SNR, density, data transfer rates, etc. Less cleverly constructed holograms do the opposite.

The first criterium of hologram construction is to make an informed, and well-considered, compromise between the quality of image reconstruction and the disk capacity. Due to the nature of the data recording on a preferred CD ROM, the holograms must be binary.

(Any optical disks that can record non-binary, analog, holograms may correspondingly be used with a motionless readout head in accordance with the principles of the present invention. However, such disks are not so readily available, nor so economical, as is standard CD ROM technology circa 1991.)

Taking into account all these requirements, two new Computer Generated Hologram (CGH) encoding methods have been developed specifically for creating superior disk holograms for use with the motionless optical readout head. Both of the preferred hologram encoding methods are based on a grey level encoding scheme using area modulation, and may be compared to existing methods.

Figure 4:
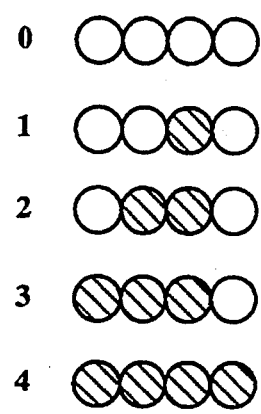
FIG. 4 is a diagrammatic representation of the grey scale of a hologram grey level area-modulated encoding used in recording the 1-D holograms on the optical disk shown in FIGS. 1 and 2.

In the first preferred encoding method, each column of the $N \times N$ pixel image to be stored on the disk is used as the 1-D input image (C) for which an hologram of size $K \times N$ will be computed. The binary array (C) is then embedded with a specific shift m into a 1-D array (O) of size M of which all elements are zeros. A random phase is then multiplied to this new input array, and its 1-D Fast Fourier Transform (FFT) is computed. The real part is extracted, and a bias equal to its minimum is added to it in order to make all the values positive. Each sample value obtained is quantized to n grey levels on a $n-1$ bit pattern using a density modulation algorithm. The grey scale, consisting of 5 grey levels, to which each sample value is quantized is shown in FIG. 4.

Figure 5:
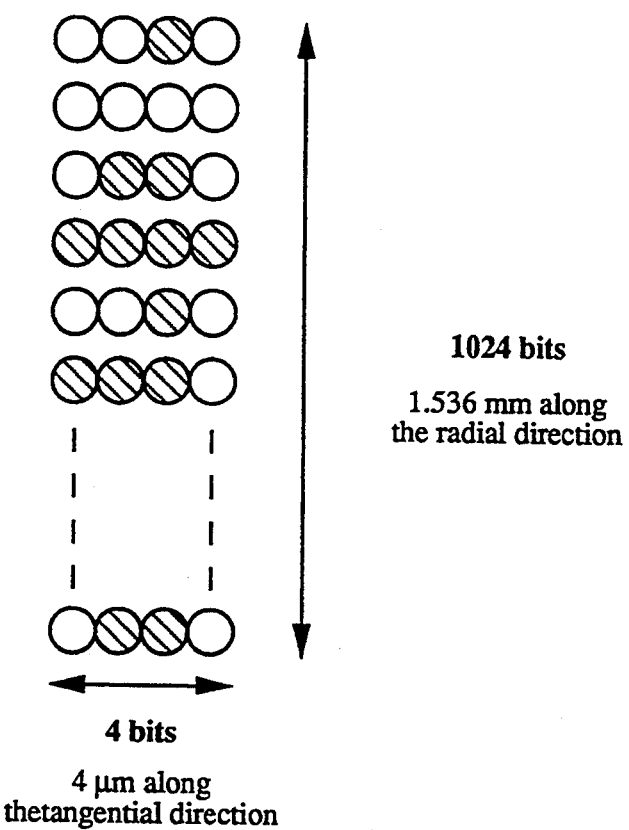
FIG. 5 is a diagrammatic representation of one data block, or one 1-D hologram, read from the optical disk in the Associative memory of the present invention.

In order to reduce speckle in the output 2-D image the resulting binary hologram is replicated once to generate a 2M cells of $(n-1)$ bit data block. An example of such a data block (containing arbitrary information) is shown in FIG. 5. For the preferred system of the present invention where 2-D images of $128 \times 128$ pixels are stored so as to be retrieved in parallel at a single time, the 128 bits of each column are encoded in a 512 cell holograms with 5 grey levels. Therefore the hologram after replication is a $4 \times 1024$ bits data block. Using a larger number of grey levels reduces the disk storage capacity but also increases the output SNR. Accordingly, and depending on the application, SNR can be traded off for capacity, and vice-versa.

It is further possible to improve greatly the performance of the holograms by calculating them with an iterative algorithm. A preferred algorithm is derived and adapted from the Direct Binary Search (DBS) algorithm discussed by M. A. Seldowitz, J. P. Allebach, and D. W. Sweeney in "Synthesis of digital holograms by direct binary search," *Appl. Opt.* 26, pp 2788-2798, July, 1987. The adaptation of the DBS algorithm is, among other purposes, to make it compatible with the grey-level area-modulated encoding method described previously.

Figure 6:
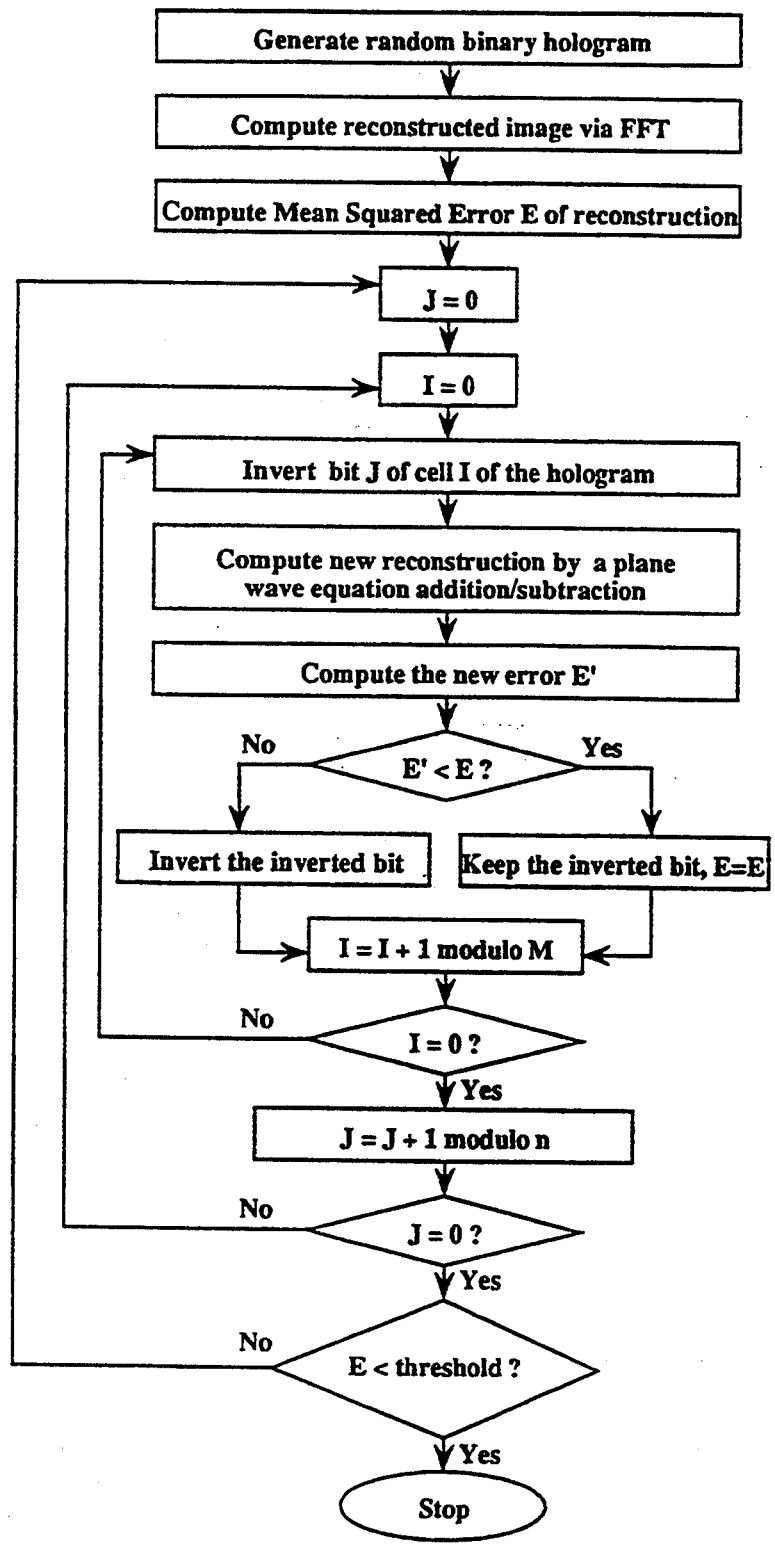
FIG. 6 is a flow chart of a preferred, iterative, transform algorithm, executable in a digital computer under software control, for the computation of 1-D grey-level holograms such as are shown in FIGS. 2 and 5, and such as are used written on and read from the optical disk in the Associative Memory of the present invention.

The flow chart of the modified and adapted DBS algorithm is shown in FIG. 6. A random grey level hologram is first generated. The reconstruction of this hologram is then computed by a Fast Fourier Transform (FFT). An error function is calculated by comparing the intensity of the reconstructed image and the original image to be reconstructed. The bits of each cell of the hologram are then inverted one after another, a new reconstruction being computed each time. However, with the iterative algorithm it is not necessary to use an FFT, since changing one bit of the hologram is equivalent of adding (bit changed from 0 to 1) or subtracting (bit changed from 0 to 1) a plane wave to the previous reconstruction. The error between the new reconstruction and the original image is calculated. If the new error is smaller than the previous one then the change of the bit is maintained and the new error is memorized. If not then the change is ignored. A loop is completed when the n grey levels of the M cells of the hologram have been tested. The iterative process continues until a predetermined number of loops are completed (ctr), or until the error is lower than a preset threshold, or until all the changes are ignored during one complete iteration.

FIG. 7 shows a Table 1 comparing (i) the preferred Fourier transform 1-D hologram encoding method ("FFT Grey level $4 \times 1$"), and (ii) the preferred modified and adapted DBS 1-D hologram encoding method ("Iterative Grey level $4 \times 1$"), with other binary encodings. The image reconstructions obtainable with each encoding method (with the motionless parallel readout head) were simulated on computer. The comparison criteria were: the diffraction efficiency and the contrast ratio. The diffraction efficiency is defined as the ratio between the intensity of the reconstructed image and the total intensity of the reconstruction. Two different cases are defined for the contrast ratio. The average contrast ratio is computed by taking the ratio of the average intensity of the "1" bits over the average intensity of the "0"bits. The worst case contrast ratio is the ratio between the lowest intensity of a "1" bit and the highest intensity of a "0" bit. The values of the Table 1 of FIG. 7 are an average for 128 holograms. Holograms of size $4 \times 1024$ bits (pixels) were used for the evaluation of all the encoding methods.

The "Cell Oriented" method of Table 1 (shown in FIG. 7) is similar to one proposed by Psaltis. See D. Psaltis et al.,"Optical memory disk in information processing," *Appl. Opt.* 29, pp 2038-2057, May 1990. However, only the phase is encoded by variation of the position of "1" bits in a cell. The "Error Diffusion" method is as defined by R. Hauck and O. Bryngdahl in "Computer-generated holograms with pulse-density modulation," *J. Opt. Soc. Am. A* 1, pp 5-10, January, 1984. Finally, both the "FFT Grey level" method and the "Iterative Grey level" methods are described in this specification.

Table 1 of FIG. 7 shows that the preferred iterative method gives the best results. However the iterative algorithm should be carefully implemented on the computer in order to optimize the computing time for the holograms. The calculation time of the holograms is normally no obstacle to the efficient and effective use of the system of the present invention in any case because the holograms are computed, and subsequently written to the optical disk by conventional methods, but one time only, but are typically used many times.

1.4 Experimental results

Experiments were conducted to test the preferred hologram encoding methods, as well as to validate the disk data layout and the entire optical system. For a first series of experiments, holograms were recorded on glass plate with an electron beam recorder (EBR) using the same feature size as an actual optical disk (1 μm spots with 1.5 μm radial pitch, see FIG. 5). Once the holograms were calculated, they were processed by a holographic CAD program which generated data files for the EBR.

A contemporary reference to such a process—which reference may or may not precede the filing date of this application depending upon the date of its publication—is H. Farhoosh, et al., "A knowledge-based system for design of electron-beam fabricated computer generated holograms," submitted to Applied Optics. The process by which the calculated binary data—which data in fact constitutes the arrayed one-dimensional holograms—is placed on an optical disk is, in any case, conventional, and is not dependent upon any particular, nor on any non-standard, CAD or recording methodology. It will be recognized by a practitioner of the optical disk recording arts that the holograms of the present invention are no more than data, and that the particular preferred method (i.e., EBR) and the particular preferred CAD software (i.e., the University of California San Diego (UCSD) CAD program of Farhoosh, et al.) for writing such holograms to CD ROM are alternatives only, and are neither necessary to realization of the recording of 1-D holograms, nor limiting or defining of the holograms so recorded.

Several holograms were recorded on glass plates of 1.2 mm thickness with a chromium film of 100 nm thickness. The optical system used for reading the disk is shown in FIG. 3. The following lenses were used. The illuminating lens L2 was of a focal length f:=100 mm; an aperture of 50×60 mm; and an f/#=2. The Fourier transform lens L3 was of a focal length f:=200 mm; an aperture of 60×50 mm, and an f/#=4. The imaging lens L4 was of a focal length f :=25.4 mm; an aperture of 22×60 mm; and an f/#=1.15.

Figure 9:
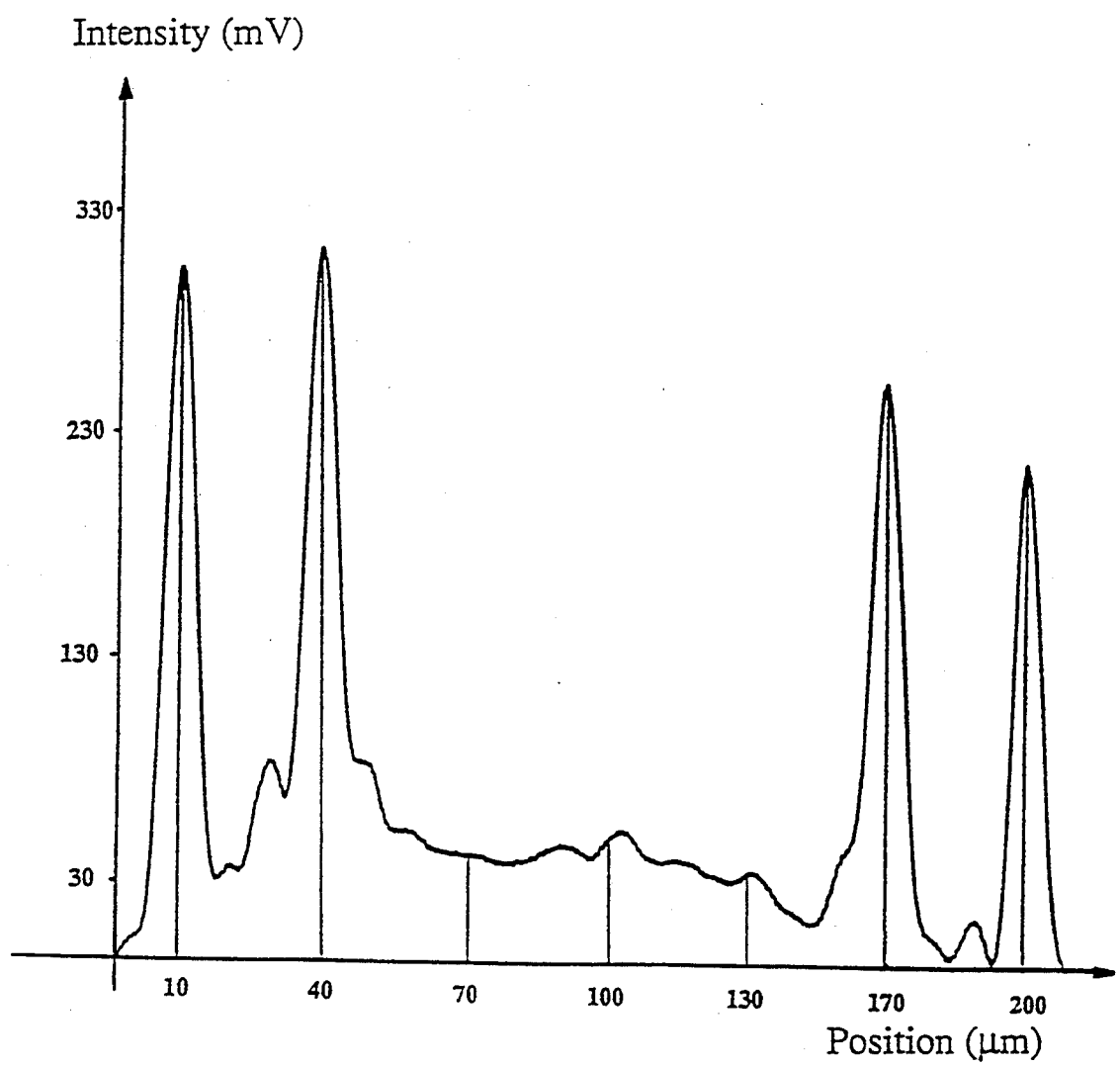
FIG. 9 is a graph showing the intensity measurement of an output image consisting of the bit sequence 1100011 as is present in a region of the E-beam test plate shown in FIG. 8, which FIG. 8 test plate and FIG. 9 graph show, in combination, that, as would be expected from established CD technology, the recording of binary bits on an optical disk is repeatable at high quality and good signal-to-noise ratio (SNR).
Figure 10:
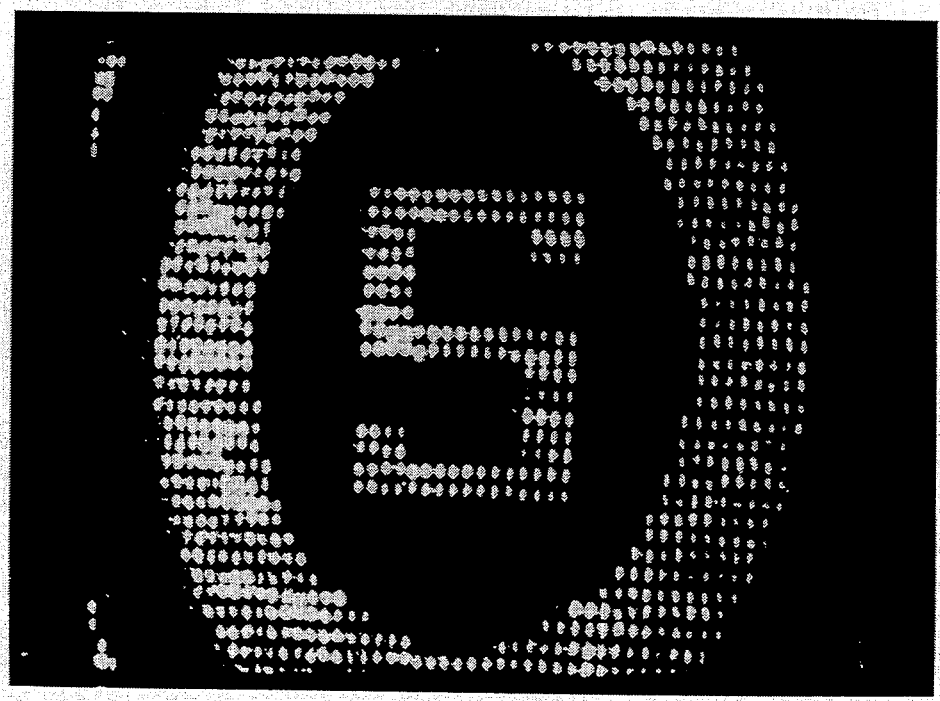
FIG. 10 is a plate showing the center portion of a 128×128 pixel point image reconstructed from a rotating optical disk read by the motionless parallel readout head shown in FIG. 3.

The plates were placed in the optical system on a rotation stage at the disk plane. Both static and dynamic measurements were conducted. The hologram reconstructions were analyzed. FIG. 9 shows the intensity of a part of a line, representing the bit sequence "1100011", in a 12833 128 pixel reconstructed image. An average SNR of about 40 is measured. Static measurements revealed that focusing errors of up to 20 μm and tracking errors of over 1 mm could be tolerated without significant degradation of the reconstructed image. Dynamic tests have also been conducted. As expected, the position of the reconstructed images in the output plane does not move when the rotating disk moves laterally due to eccentricity. FIG. 10 shows the center portion of a 128×128 pixel image reconstructed from a rotating disk.

1.6 Alternative lens design, including a Hybrid Lens

The parallel readout optical disk system previously shown in FIG. 3 includes two separate cylindrical lenses having different focal lengths: one for imaging in the X-direction, and one for Fourier transforming in the Y-direction. Besides being bulky and heavy, these cylindrical lenses (i) are extremely difficult to align and (ii) suffer from severe aberrations.

CODE V ® optical design software (CODE V is a registered trademark of Optical Research Associates, Pasadena, Calif.) available from Optical Research Associates, Pasadena, Calif. has been used to design a single hybrid optical lens to replace the function of the two lenses and to correct for the aberrations. The optical systems 10 evaluated are diagrammatically illustrated in FIGS. 11a and 11b, respectively showing the parameters of the compound, and of the hybrid, lens systems.

An immediate, first, insight gained from computerized optical analysis is that the orthogonal cylindrical refractive lenses L3, L4 shown in FIG. 3 would better be diffractive lenses. As shown in the Table 2 of FIG. 12, because of the difference in focal lengths in the X and Y directions, it has been found advantageous to use orthogonal cylindrical diffractive lenses (OCDL).

1.6.1. Orthogonal Cylindrical Diffractive Lenses

Orthogonal Cylindrical Diffractive Lenses (OCDL) are particularly well suited for replacing the two refractive cylindrical lenses in the parallel readout optical disk system. This section introduces the basics of OCDL necessary to follow the design process of the OCDL in the next section. A more detailed description of the operation and advantages of OCDL can be found in the previous publication of K. S. Urquhart, H. Farhoosh, and S. H. Lee, "Diffractive lens utilizing orthogonal cylindrical Fresnel zone plates," *Proc. SPIE* 1211, 184–190 (1990).

OCDL make use of the fact that the quadratic phase function is separable in X and Y:

$$e^{\frac{j\pi}{\lambda f}(x^2+y^2)} = e^{\frac{j\pi}{\lambda f_x}(x^2)} e^{\frac{j\pi}{\lambda f_y}(y^2)}$$

The X and Y focal lengths are now independent. This allows the X and Y cylindrical phase functions to be quantized separately and then combined in a computer to make up the pattern file for fabrication. If $f_x$ and $f_y$ are equal, then the diffractive lens can be used for imaging like a normal diffractive lens. OCDL can be used equally well when $f_x \neq f_y$, as is the case for the optical disk readout system of the present invention.

Besides allowing independent X and Y focal lengths, OCDL also have the advantage that all of the fringes are made up of rectangles. This eliminates the fracturing of curved fringes into e-beam compatible shapes, which takes large amounts of data and time. Also, an e-beam lithography system can fabricate much smaller rectangular fringes than curved fringes.

1.6.2 Optical System Designs Comparison

1.6.3 Use of Optical Design Software

CODE V ® optical design software (CODE V is a registered trademark of Optical Research Associates, Pasadena, Calif.) available from Optical Research Associates, Pasadena, Calif. was used to ray trace the elements of several lens systems suitable for use in the parallel optical readout head. The zoom (ZOO) option was used to separate the analysis into two distinct problems while studying one system. The vertical axis was used to optimize the system for Fourier transforming between the angles of +2.4° and +7.3° (first order reconstruction). The horizontal axis was used to optimize the system for imaging with a magnification of five. The horizontal image plane was forced to be coincident with the vertical Fourier plane.

For the designs that included diffractive lenses, the holographic optical element (HOE) option was used to model the diffractive lenses by specifying the coefficients of x2 and y2 (HCO C3, C5). In all cases, the automatic optimization (AUT) feature was used to alter the variables in the system in order to minimize the error function. The default error function in the CODE V program is simply a measure of the focus spot size obtained from the tracing of individual rays through the optical system.

1.6.3 Analysis of a Refractive Optical System

Figure 13A:
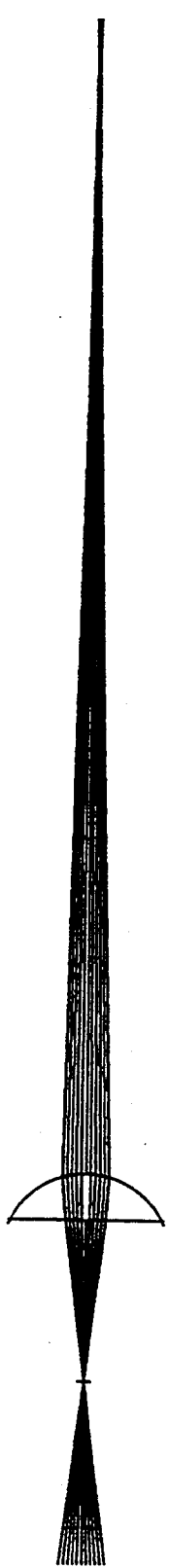
FIG. 13 is a diagram of the a ray tracing of a computerized analysis of a that embodiment of a motionless parallel readout head using two orthogonal cylindrical refractive lenses, as shown in FIG. 3.
Figure 13B:
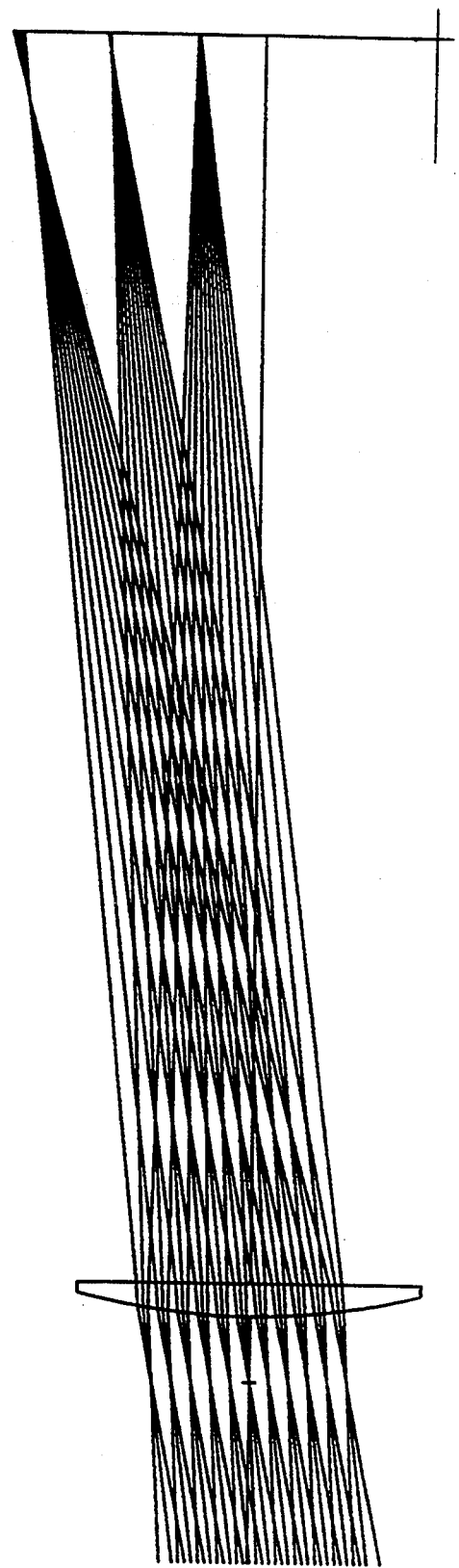

A first lens system analyzed for use in the parallel optical readout head was an all-refractive optical system made up of two cylindrical lenses. This is the lens system that was shown in FIG. 3 for implementing the parallel readout optical readout head. FIG. 13, consisting of FIG. 13a and FIG. 13b, shows a ray tracing of the first lens system as output from the CODE V software program. FIG. 13a shows a top view of the imaging function of the second cylindrical lens (f=25.4 mm). A side view of the same imaging function is shown in FIG. 13b. FIG. 13b also displays the Fourier transforming function of the first cylindrical lens (f=200 mm). The error function given by the CODE V software program was 15,837.

As can be seen by the beam spread in the FIG. 13b, the Fourier transforming lens exhibits large amounts of spherical aberration. This means that rays from the top of the aperture are focussed below rays from the bottom of the aperture. Since holograms are stored along a radial line of the disk, reconstructions from one side of the 2-D image are shifted vertically with respect to the reconstructions on the other side of the image. This results in a reconstruction that is not rectangular, but is distorted due to non-horizontal lines of pixels.

1.6.4 Analysis of a Diffractive Optical System

If both cylindrical refractive lenses from the previous system of section 1.6.3 are replaced with cylindrical diffractive lenses, the system performance can be greatly improved.

A first advantage is that both lens functions can be placed in the same plane. This significantly reduces the effort needed to align the system since both lens functions can be fabricated on the same substrate and will be automatically orthogonal.

A second advantage is reduced aberrations.

An analysis—equivalent to the analysis of FIG. 13—of an all diffractive lens system for use in the parallel optical readout is shown in FIG. 14, consisting of FIG. 14a and FIG. 14b. As can be seen by the beam spread in the FIG. 14b, the Fourier transforming lens continues to exhibit some amount of spherical aberration. However, as is also shown in FIG. 14b, the spherical aberrations can be partially eliminated due to the computerized design of the diffractive lenses.

The error function calculated by the CODE V software program is just 950.48 for this configuration, a reduction by a factor of almost 17 over the all refractive lens system. In this case, the imaging lens has a focal length of 41.7 mm, while the Fourier transform lens has a focal length of 250 mm. This yields a magnification of five in the imaging direction.

1.6.5 Analysis of a Hybrid Refractive/Diffractive Optical System

Figure 15A:
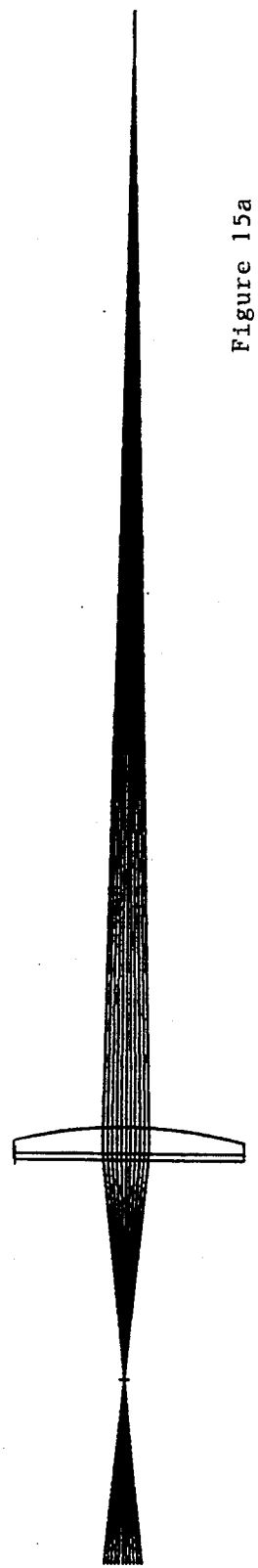
FIG. 15 is a diagram of the a ray tracing of a computerized analysis of a that preferred embodiment of a motionless parallel readout head using a Hybrid refractive/diffractive Optical Lens (HOL) as shown in FIG. 11b.
Figure 15B:
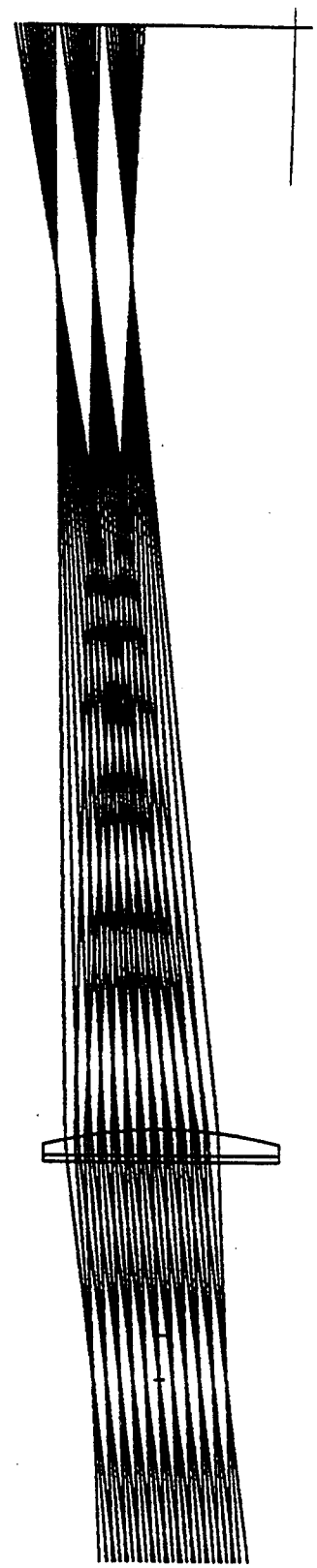

The aberrations can be further reduced if the cylindrical diffractive lenses are combined with a spherical refractive lens. This is illustrated in FIG. 15, consisting of FIG. 15a and FIG. 15b, where the diffractive lenses are placed on the plano surface of the spherical lens.

Optimization using the CODE V program yielded an interesting result. The aberrations were minimized for a spherical lens with a focal length of 200 mm, an imaging diffractive lens with a focal length of 52.7 mm, and a Fourier transform lens with a focal length of −946 mm. This combination yields the same effective optical power in the vertical and horizontal directions as the previous all diffractive case, but now one of the focal lengths of one of the cylindrical diffractive lenses is negative. The error function calculated by the CODE V program has now been reduced to 155.52, an improvement of more than 100 over the all refractive cylindrical lens case.

This configuration of a Hybrid refractive/diffractive Optical Lens (HOL) has the same alignment advantage as the all diffractive case (shown in FIG. 14), but now the f/# of both the diffractive lenses has been increased, particularly for the Fourier transform lens. This makes the fabrication of the diffractive lenses easier due to the resultant larger fringe spacing. An extra alignment step has now been introduced between the diffractive lenses and the spherical lens. Luckily, the analysis revealed that the two components could be misaligned laterally by up to 2 mm with negligible image degradation (error function < 10), but there would be a small image shift in the output plane.

1.6.6 Experimental Validation of a Hybrid Optical Lens (HOL) Design

The Hybrid refractive/diffractive Optical Lens (HOL) described in the last section was fabricated using an OCDL for the diffractive lenses and a Melles Griot 200 mm focal length spherical refractive lens. The diffractive lens was fabricated using well-developed binary optics techniques. Reference, for example, G. J. Swanson, "Binary optics technology: the theory and design of multi-level diffractive optical elements," Massachusetts Institute of Technology, Lincoln Laboratory, Technical Report #854, 17-24 (1989).

Four phase levels were used for a theoretical diffraction efficiency of 81%. The actual diffraction efficiency was not measured due to the lack of an actual focus spot, since the X and Y focal lengths were different. The minimum feature size fabricated was 1.3 m in the horizontal direction by 5.3 m in the vertical direction.

Figure 11A:
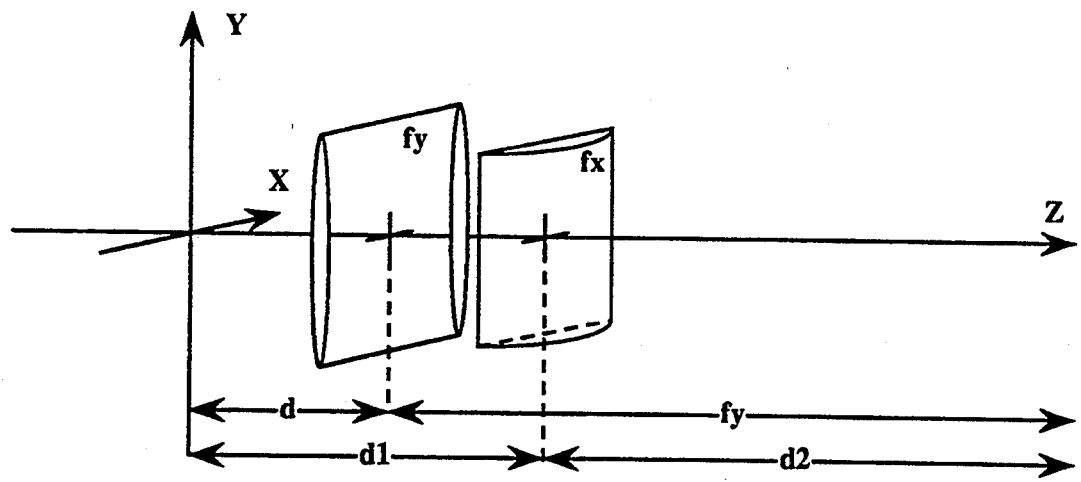
FIG. 11, consisting of FIG. 11a and FIG. 11b, is a diagrammatic representation of the replacement of the two orthogonal cylindrical refractive lenses shown in FIG. 3 and FIG. 11a with one Hybrid refractive/diffractive Optical Lens (HOL) shown in FIG. 11b.
Figure 11B:
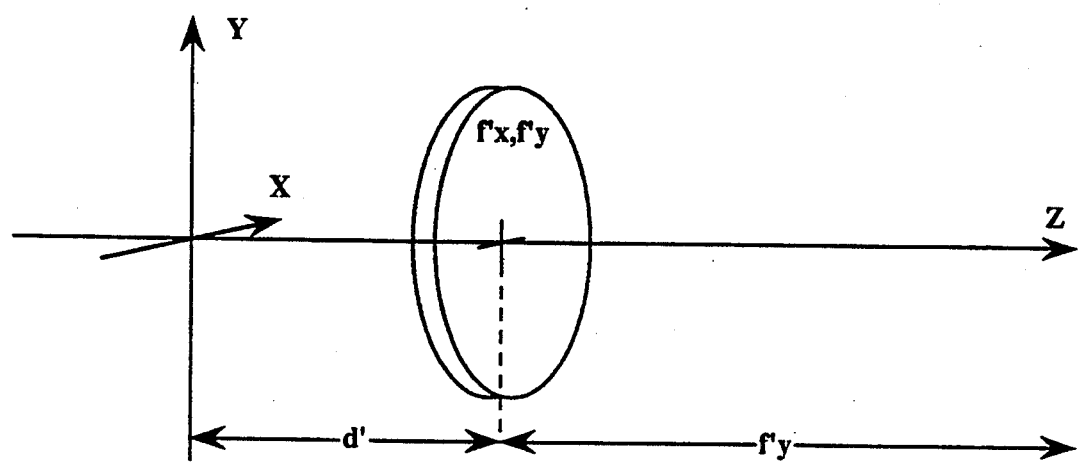
Figure 16:
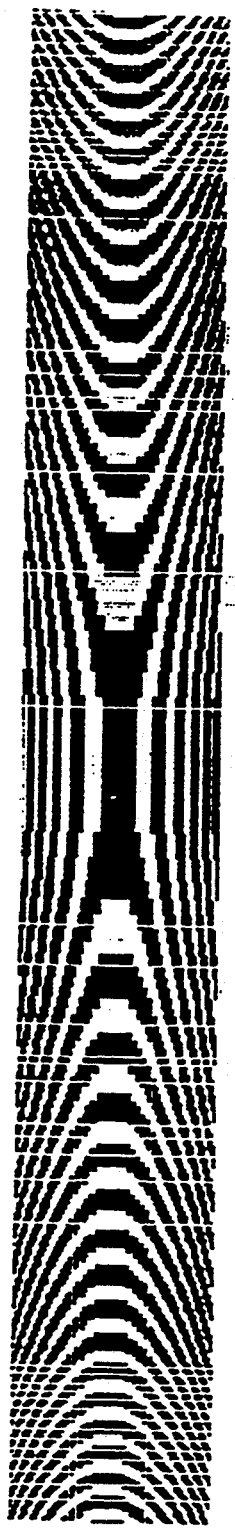
FIG. 16 is a magnified pictorial representation of a first mask, corresponding to a binary phase, used in the fabrication of the Hybrid refractive/diffractive Optical Lens (HOL) shown in FIG. 11b and analyzed in the ray trace diagram of FIG. 15.
Figure 17:
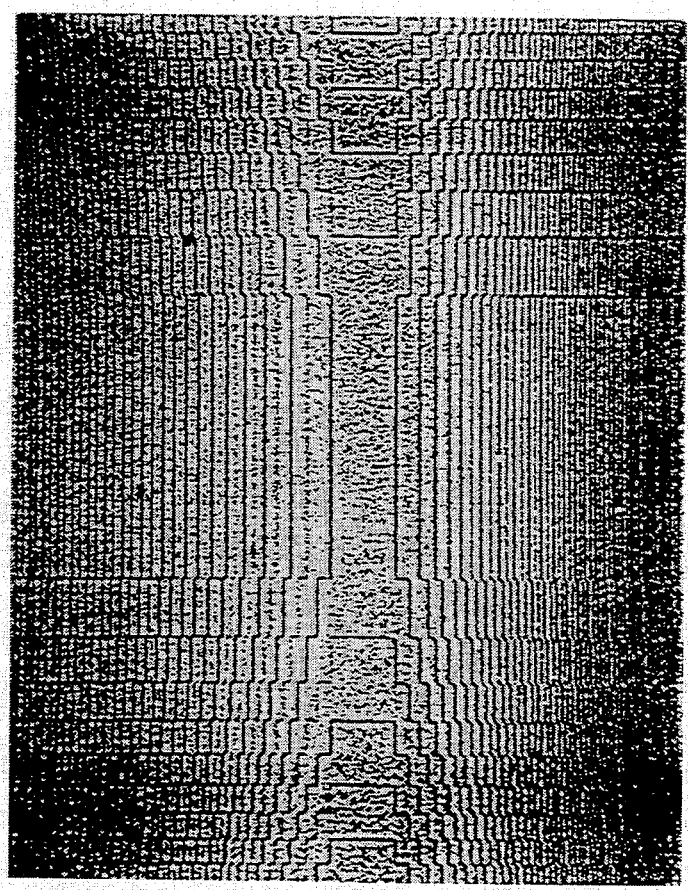
FIG. 17 is a plate showing a photomicrograph at 100×magnification of a central portion of a particular Orthogonal Cylindrical Diffractive Lens (OCDL) actually used in simulation of the optical characteristics of the preferred Hybrid refractive/diffractive Optical Lens (HOL) shown in FIG. 11b and analyzed in the ray trace diagram of FIG. 15.

A magnified pictorial representation of a first mask, corresponding to a binary phase, that was used in the fabrication of the Hybrid refractive/diffractive Optical Lens (HOL) shown in FIG. 11b and analyzed in the ray trace diagram of FIG. 15, is shown in FIG. 16. A 100× photomicrograph of the central portion of the OCDL is shown in FIG. 17.

Alignment of the diffractive lens to the spherical lens was accomplished with the help of alignment marks present on the diffractive lens substrate. As mentioned before, the alignment tolerance was very lenient, so the alignment was performed under a microscope at 50× magnification. It is estimated that the alignment accuracy was ±50 μm. Once aligned, the components were epoxied together at the edge of the spherical lens.

Figure 18:
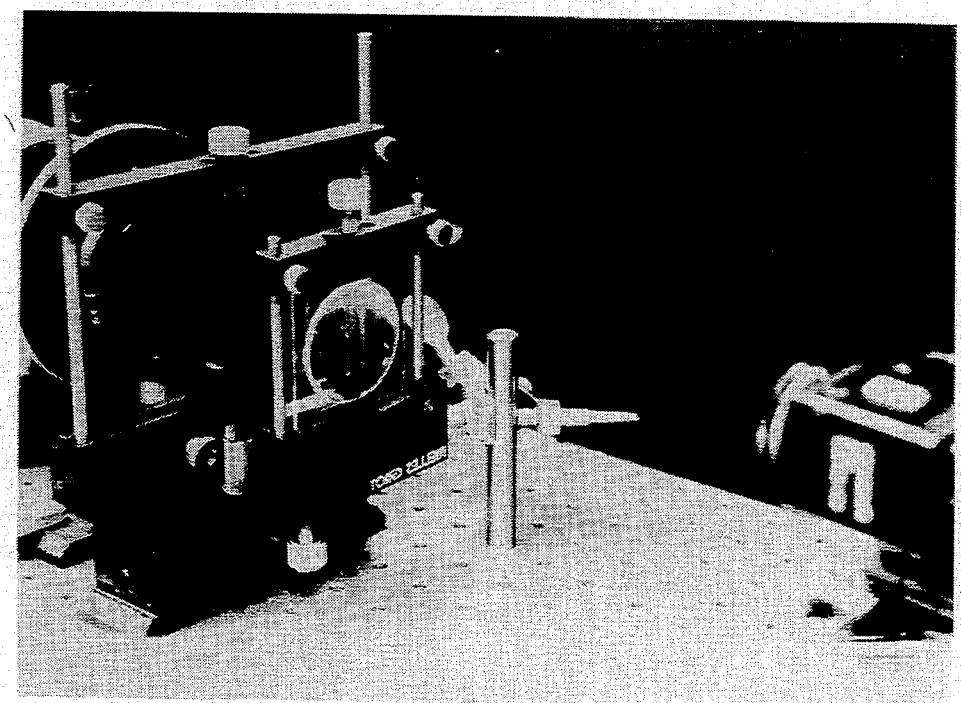
FIG. 18 is a plate representing a photograph of an experimental setup for validation and measurement of the motionless optical readout head, the experimental setup including from right to left an Ar+ laser producing collimated laser light, a slit aperture, and E-beam plate simulating an optical disk, the preferred Hybrid refractive/diffractive Optical Lens (HOL), and a CCD camera.
Figure 19A:
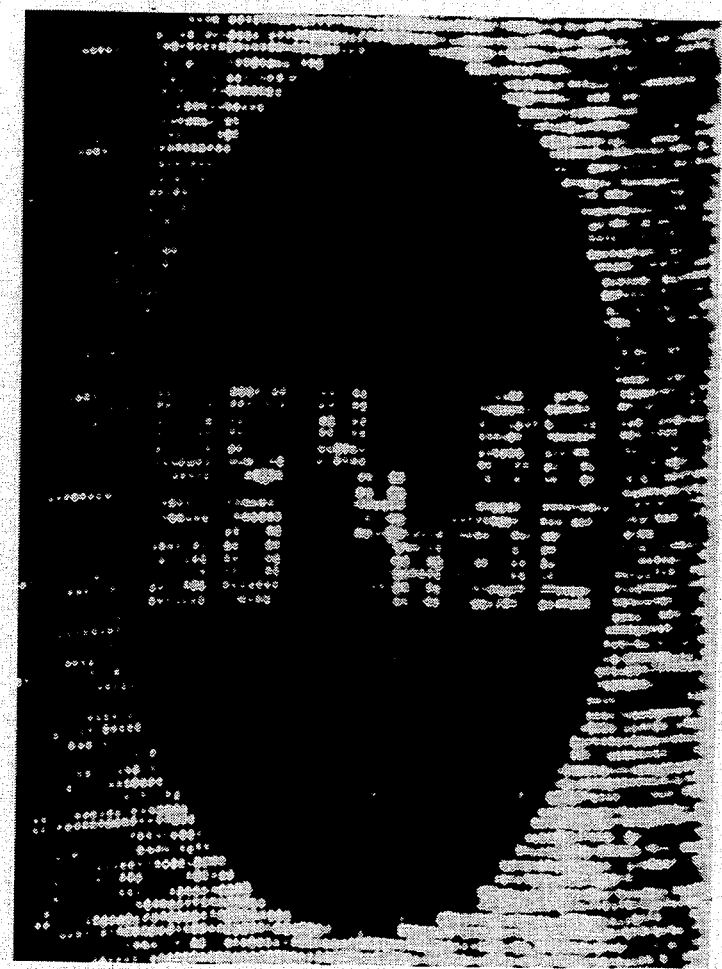
FIG. 19, consisting of FIG. 19a and FIG. 19b, are plates representing images produced by the CCD camera shown in FIG. 18, which images respectively represent (i) and output image derived with an all refractive optical readout head, and (ii) and image derived by use of the preferred Hybrid refractive/diffractive Optical Lens (HOL) optical readout head.
Figure 19B:
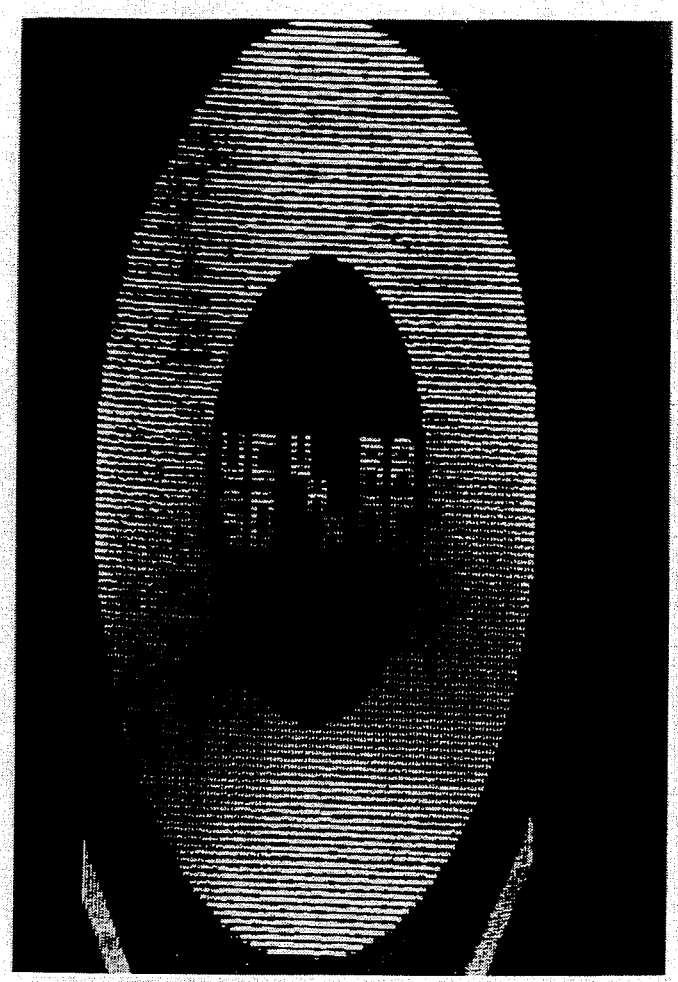

FIG. 18 shows the setup of an optical bench used to test the Hybrid Optical Lens (HOL). The alignment of the lens to the hologram plate was much simpler and took less time than the alignment of the refractive cylindrical lenses in the alternative optical system. FIG. 19, consisting of FIG. 19a and FIG. 19b, compares the output of the system using the original refractive cylindrical lens system shown in FIG. 19a to the output obtained using the new Hybrid refractive/diffractive Optical Lens shown in FIG. 19b. As can be seen, the new Hybrid Optical Lens (HOL) performs well. In particular, the spherical aberrations present in the refractive system have been almost totally eliminated so that the 1-D reconstructions are much better aligned vertically in the output plane. Also, the uniformity of both intensity and focus spot size is much improved using the Hybrid Optical Lens.

1.6.7 Recapitulation, and Conclusions

A hybrid optical lens (HOL) is superior to either combination of cylindrical lenses. Two separate designs using Orthogonal Cylindrical Diffractive Lenses (OCDL) were studied, both designs overcoming the problem associated with refractive cylindrical lenses. Designs were studied with both focal lengths positive but different. Still another design studied was a Hybrid refractive/diffractive Optical Lens (HOL) that combines an Optical Element (OE) with a plano-convex spherical lens. In this case one focal length is positive while the other is negative.

The respective optical performance of three different systems is shown in Table 2 of FIG. 12: (i) two orthogonal cylindrical diffractive lenses, (ii) two orthogonal cylindrical diffractive lenses, and (iii) a Hybrid refractive/diffractive Optical Lens (HOL). The error functions were calculated with the CODE V optical design software program, and correspond to the distance of all the rays to the chief ray in the output plane. The results show that the best system is the Hybrid Optical Lens (HOL) on the basis of both optical performance and fabrication requirements.

A ray-tracing analysis of (i) the orthogonal cylindrical refractive lenses (shown in FIG. 3, and originally discussed in conjunction therewith), (ii) the orthogonal cylindrical diffractive lenses (introduced in FIG. 11a, and compared in Table 2 of FIG. 12, and (iii) the Hybrid refractive/diffractive Optical Lens (the HOL, compared in Table 2 of FIG. 9) are respectively shown in FIGS. 13–15.

The Hybrid Optical Lens (HOL) will be understood to be a (superior) replacement for the two Orthogonal Cylindrical Diffractive Lenses (OCDL). Indeed, the HOL raises the required f/# of the OCDL, which in turn reduces the size of its features in replication of the performance of the OCDL. Thus a larger size OCDL with more phase levels and a higher diffraction efficiency can be fabricated more easily, and at a smaller size, as a HOL.

As an illustration of the design of the HOL, a first mask of its first diffractive element can be seen in FIG. 16. A plate corresponding to a photomicrograph (100× magnification) of the central portion of an HOL, showing its simultaneous realization of the functions of both OCDL, is shown in FIG. 17. A photograph of a test of the HOL on an optical bench is shown in FIG. 18. From right to left FIG. 18 shows a laser source of collimated light (Ar+), a slit aperture, an e-beam patterned plate (simulating an optical disk), the Hybrid refractive/diffractive Optical Lens (the HOL), and a CCD camera for recording reconstituted 2-D images.

In summary recapitulation, the refractive system in the parallel readout optical disk system was first analyzed. A new Hybrid refractive/diffractive Optical Lens (HOL) was designed using the CODE V optical design software. An orthogonal cylindrical diffractive lens was used to realize the diffractive portion of the hybrid lens due to the fact that $f_x$ and $f_y$ were different in both magnitude and sign. The performance, as measured by the CODE V optical design software running in a computer, improved by a factor of over 100. Besides aberration correction, the number of individual elements was reduced, which significantly simplified the alignment process. Experimental results show marked improvement in output uniformity and distortion over the alternative refractive optical system.

1.6.8 Extensions of the Principle of the Parallel Optical Readout Head

Figure 20A:
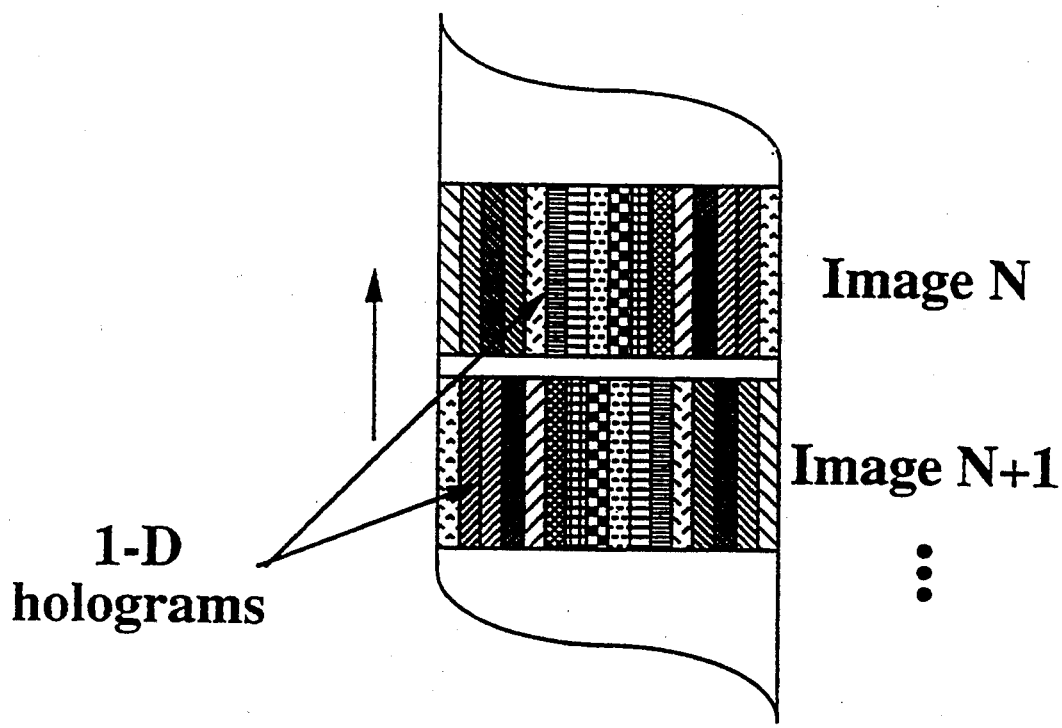
FIG. 20, consisting of FIG. 20a and FIG. 20b, is a diagrammatic representation of the application of the principles of recording and reading information encoded in 1-D holograms to the organization of 1-D holograms in two different formats on optical tape, each of which formats may be read by a motionless readout head.
Figure 20B:
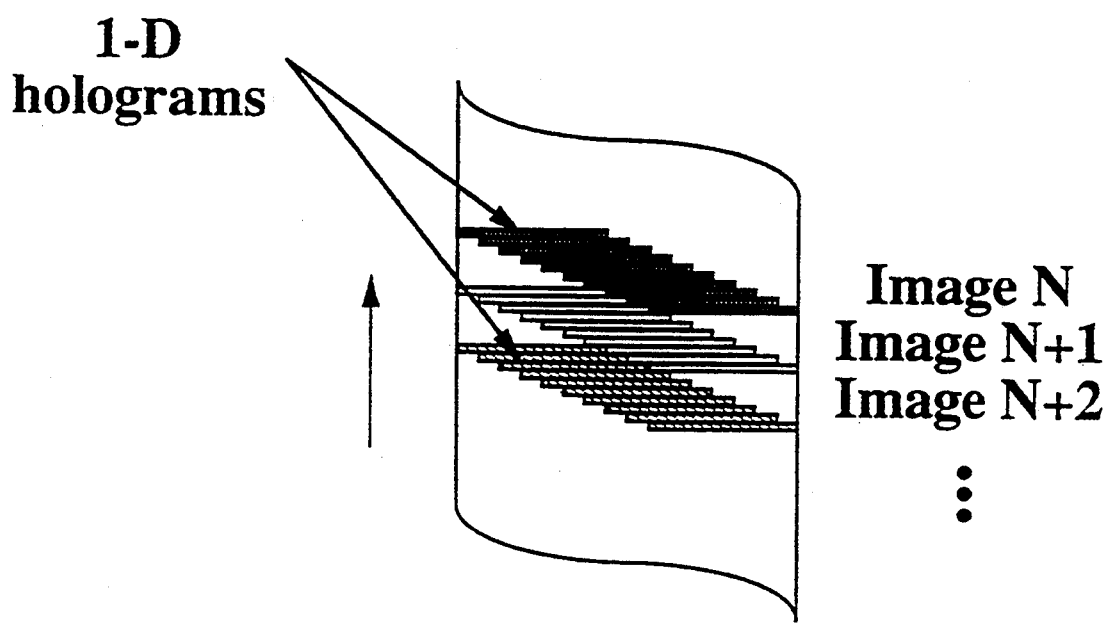

It is not necessary that the one-dimensional holograms should be recorded upon, nor read from, an optical disk. The 1-D holograms may, for example, be recorded upon optical tape. Two different manners of organizing, or placing, the holograms on optical tape are shown in FIGS. 20a and 20b. The holograms are read along a focal line that passes through successive groups of arrayed holograms, where each group of 1-D holograms contains a number of individual holograms, as the optical tape moves. The organization, and array, of FIG. 20b is preferred because the successive groups, or arrays, of holograms are closer together, and pass under the read head, relatively more quickly then when organized as shown in FIG. 20a. It should be understood that the apparent wasted recording area shown in FIG. 20b is a function of the scale of the illustration only, and that the successive arrays of holograms are really fairly tightly packed similarly to the disk surface shown in FIG. 2.

An optical tape may have a long seek time for any individual hologram, but is obviously capable of storing, in accordance with the resolution of the media of the tape and the scale of the patterning of this media with 1-D holographically-encoded information, stupendous amounts of information. Because the read head need only be relatively crudely, and absolutely permanently, focused to the optical tape, it is possible to "fly" the optical tape past the read head at high speed, and image data may be retrieved form the optical tape at high bandwidths which typically only start in the gigabit per second range, and which can theoretically be pushed much higher.

2. Application of the Optical Disk Readout System of the Present Invention to An Associative Memory

2.1 Associative Memory Overview

An associative memory implemented by use of the parallel readout optical disk in accordance with the present invention is shown in FIGS. 21–45.

Figure 21:
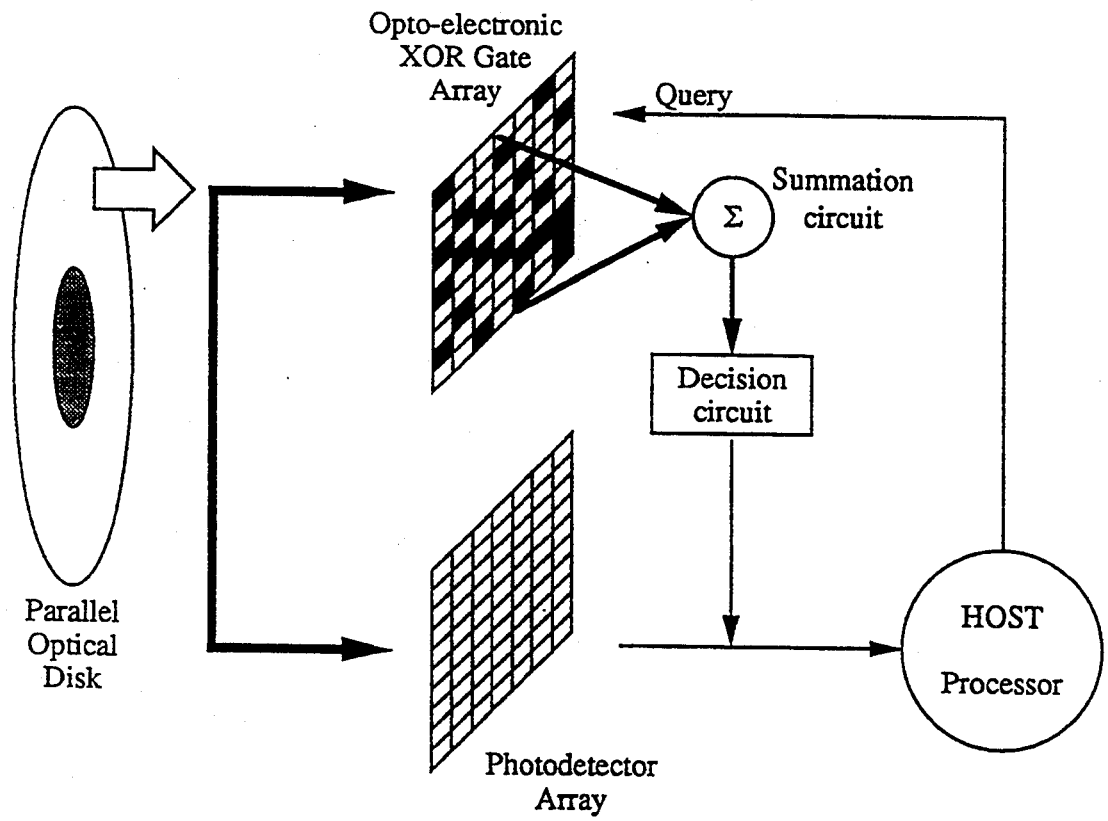
FIG. 21 is a block diagram of the design of an Associative memory in accordance with the present invention using the motionless parallel readout head for an optical disk recorded with arrayed one-dimensional holograms.

The associative memory diagrammatically shown in FIG. 21 includes, as well as the parallel readout optical disk, an opto-electronic XNOR gate array, a photodetector array and a single variable threshold summation circuit. In one of its embodiments (further embodiments being discussed hereinafter), a 2-D query from the host computer is electronically loaded onto the XNOR gate array. The query image is then compared serially to the binary images from the optical disk (bitwise matching operations). The output of the variable threshold detector is then fed into the decision circuit which controls the data flow between the photo-detector array and the host computer.

Figure 22:
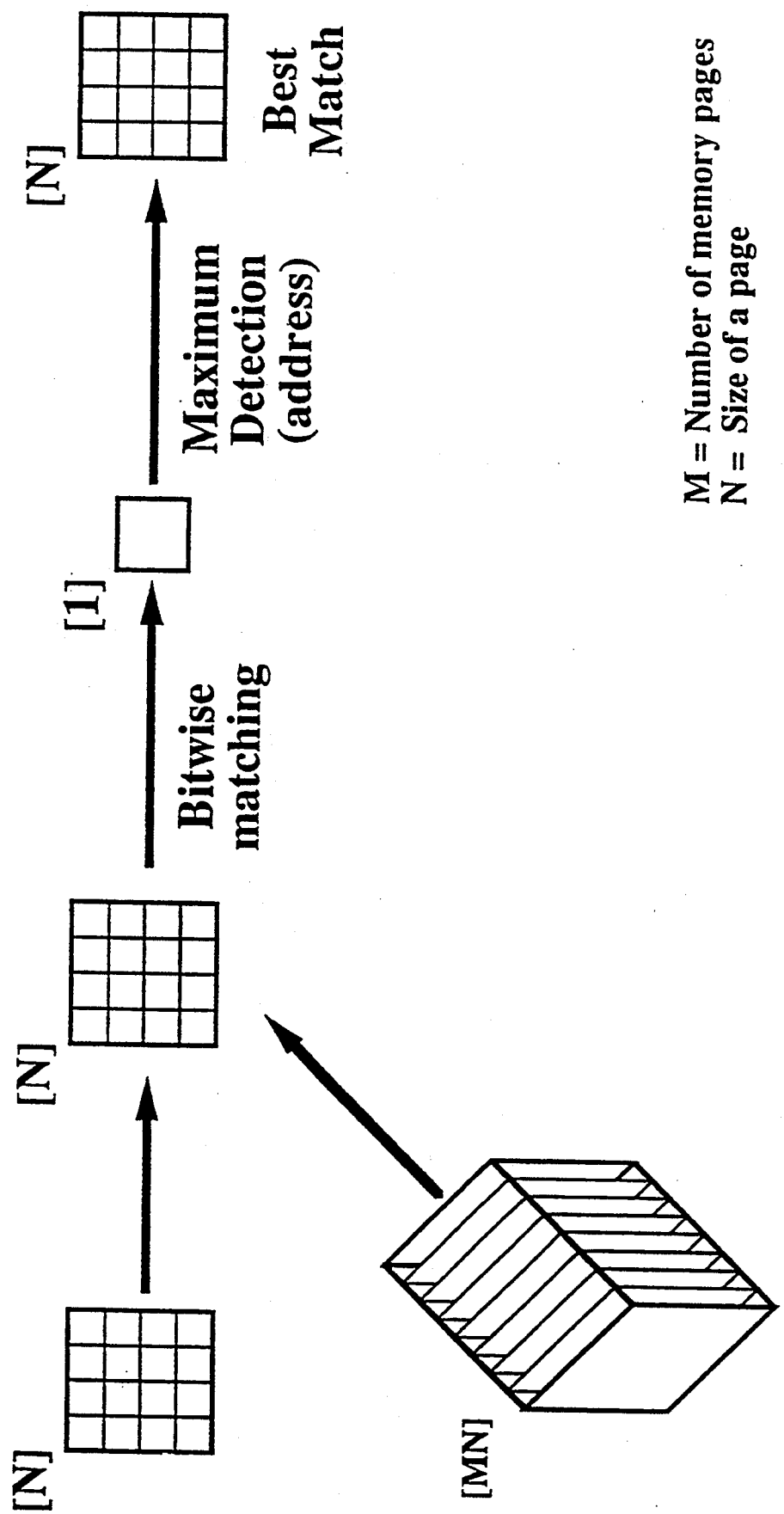
FIG. 22 is a diagrammatic representation of the performance in of a serial inner-product algorithm for image matching in an Associative memory in accordance with the present invention.

This associative memory using the optical disk is well suited to implement a page serial, bit parallel inner product algorithm system which is diagrammatically represented in FIG. 22. (It also implements other algorithms, as explained hereinafter.) The search time of this method is higher than those of outer product and parallel inner product methods. Reference P. Marchand, A. Krishnamoorthy, P. Ambs, and S. Esener, "Opto-electronic associative recall using motionless-head parallel readout optical disk", in SPIE Proceedings 1347, San Diego, 1990 (published January, 1991). However, due to the high data rate achievable with the parallel readout optical disk, the page serial, the bit parallel inner product method is still capable of low retrieval times.

The optical disk readout system can support two modes of operation for the associative memory. In the first mode, the threshold value is preselected. Local logic Exclusive NOR (XNOR) operations are performed between the bits of the electronic query and the corresponding bits of the disk image. Therefore only images that are close to the query will be retrieved by the host computer via the photodetector array. The second mode finds the best match to the query image. On the first rotation, the Hamming distance for each image is input to the decision circuit in the manner described above. The best match is identified and retrieved on the subsequent rotation.

A key element of the associative memory system using the motionless head disk is the optoelectronic XNOR integrated circuit which is computing the inner product. Two different approaches have been considered to realize this circuit, one analog approach and a digital approach.

2.2 Analog Approach to Realizing an Associative Memory Decision Circuit

Figures 23A, 23B:
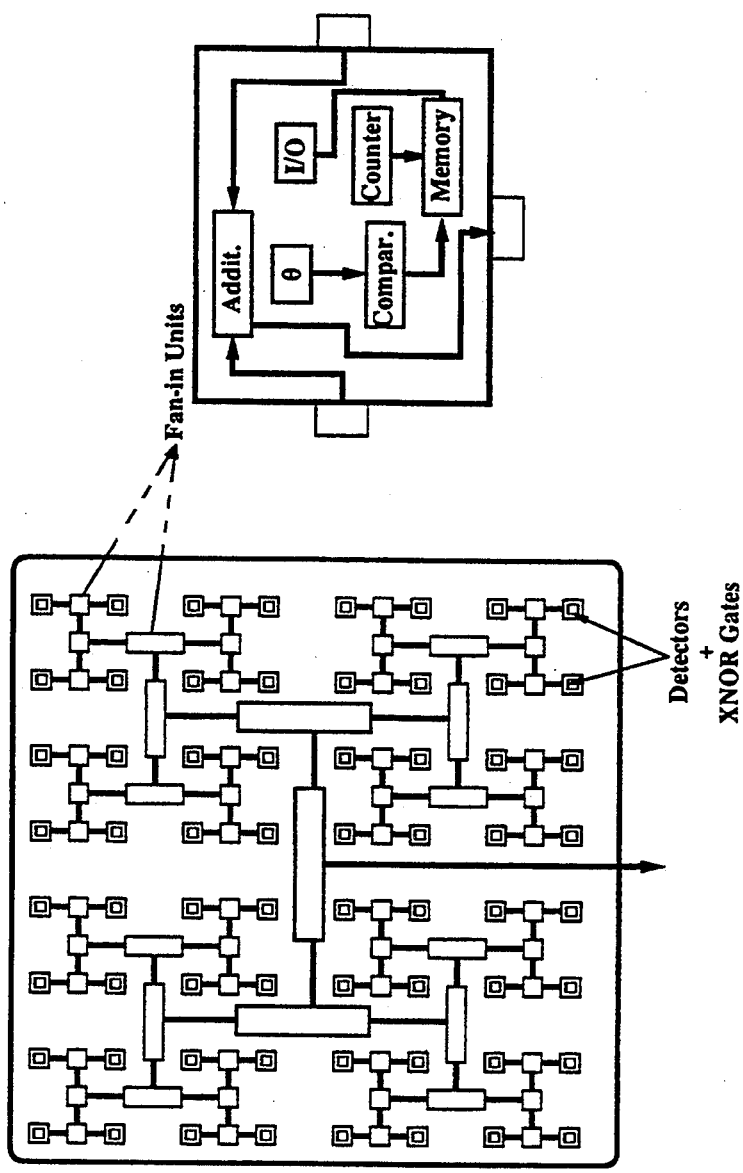
FIG. 23a is a diagrammatic view.
FIG. 23b is a detailed view of a partial schematic diagram of a fan-in unit, of an Opto-Electronic Integrated Circuit (OEIC) based on an H-tree structure, and usable with the motionless parallel readout head for an optical disk recorded with arrayed one-dimensional holograms, in order to implement the Associative memory in accordance with the present invention.

An optoelectronic integrated circuit of an Associative memory is pictorially represented in FIG. 23a. A schematic view of a decision circuit in such an optoelectronic integrated circuit within an Associative memory is shown in FIG. 23b. Within the decision circuit an XNOR gate array is coupled to an optically and electronically addressed 2-D PLZT SLM. Reference T. H. Lin, A. Ersen, J. H. Wang, S. Dasgupta, S. C. Esener, S. H. Lee, "Two-dimensional spatial light modulators fabricated in Si/PLZT," *Appl. Opt.* 29, pp 1595–1603, April, 1990. Reference also copending U.S. patent application Ser. No. 07/632,033 filed Dec. 21, 1990, to Esener, et al. for a SYSTEM AND METHOD FOR PRODUCING ELECTRO-OPTIC COMPONENTS INTEGRATABLE WITH SILICON-ON-SAPPHIRE CIRCUITS, the contents of which application are incorporated herein by reference. The gate array is simply silicon circuitry that performs the Exclusive-NOR (or, equivalently, the Exclusive-OR) function.

Each unit cell receives three inputs as well as control information. The query bit is electronically loaded from the host computer. The corresponding bit from the stored images arrive from the disk at the detector. The third input is a clock obtained from the disk that signals when a complete image is under observation. The detector circuits of the XNOR gate array are designed to provide large noise margins for the detected input bits. The SNRs achievable with the disk holograms can therefore be tolerated since each detector circuit restores logic levels. The logic circuitry drives the PLZT modulator so as to allow light to pass when a bit match occurs. Therefore, the total output light represents a logic Exclusive-NOR operation of the query bits and the corresponding bits of the stored image.

An advantage of this approach is that the summation operation can be performed at high speed and in a single step. There is a limitation to this approach. The minimal Hamming distance which can be distinguished is limited by the contrast ratio of the Si/PLZT modulators and by the dynamic range of the variable threshold detector.

It is anticipated that the analog form of the optoelectronic associative memory in accordance with the present invention would be best suited to optical memories that have very low latency times between retrieved images and/or very small images.

2.3 Digital Approach to Realizing an Optoelectronic Integrated Circuit

The limitations of the previously described analog approach can be overcome by replacing the Si/PLZT XNOR gate array with an Opto-Electronic Integrated Circuit (OEIC) based on a tree structure. The concept of optoelectronic integrated circuits using a tree structure is discussed by G. Marsden et al. in "Dual-scale topology optoelectronic processor," OSA annual meeting '90 Boston, paper TUJJ2, November, 1990; and also by A. Krishnamoorthy et al., "Optoelectronic associative memory using a parallel readout optical disk," in OSA annual meeting '90, Boston, paper MJ5, November, 1990.

The OEIC has light detectors to receive the light from the images read from the disk. It also has local silicon circuitry to perform the XNOR operation between the disk images bits and the query bits and fan-in units to perform the sums of the bits down the tree. A schematic view of such an OEIC, based on a H-tree structure is shown in FIG. 23b. A H-tree structure is described by C. Mead and M. Rem in the *IEEE Journal of Solid State Circuits*, Vol. 14, No. 2, Apr., 1979; and by the aforementioned A. Krishnamoorthy et al.

Using this OEIC system, the Hamming distance between a query and the image stored on the disk can be measured with a precision of one bit. Furthermore, the system maintains high throughput, since all operations down the tree can be pipelined due to the H-tree structure where all electronic lines have equal length and introduce no signal skew.

A simulation of this system has been implemented. The images are read from the disk using a CCD camera interface to a PC computer. Once an image is read, it is digitized and compared (XNOR operations) to the electronic query. The results of the XNOR operations are then summed and the Hamming distance between the query and the disk images is calculated.

Figure 24A:
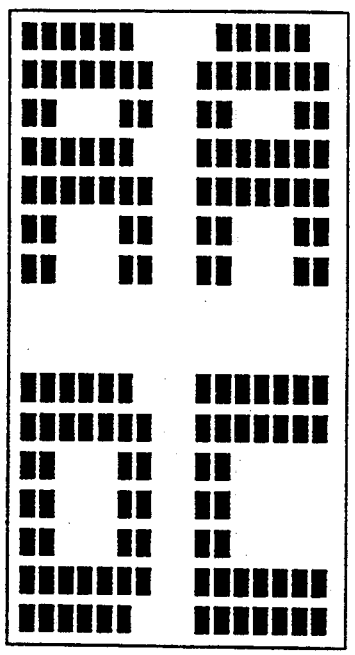
FIG. 24, consisting of FIGS. 24a through 24c, is a sequence of diagrammatic representations of (i) an arbitrary input query having the arrayed letters "RADC"; (ii) a pixel-bit by pixel-bit output of the XNOR gates shown in FIGS. 21 and 23, which output shows a complete match with one image of the memory, and (iii) the image recovered from the memory, namely the optical disk recorded with arrayed one-dimensional holograms that is read by the motionless readout head.
Figure 24B:
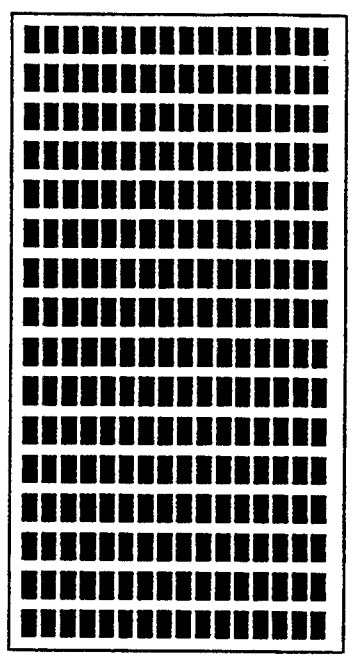
Figure 24C:
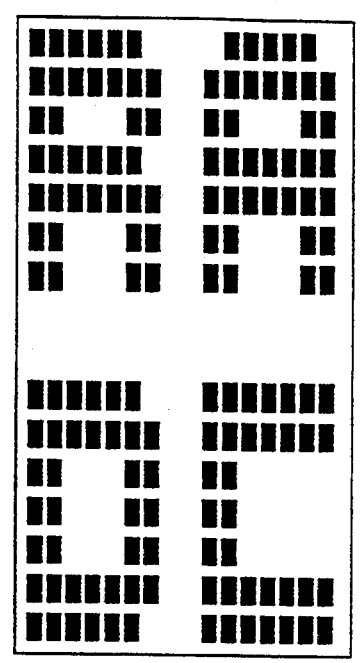
Figure 27:
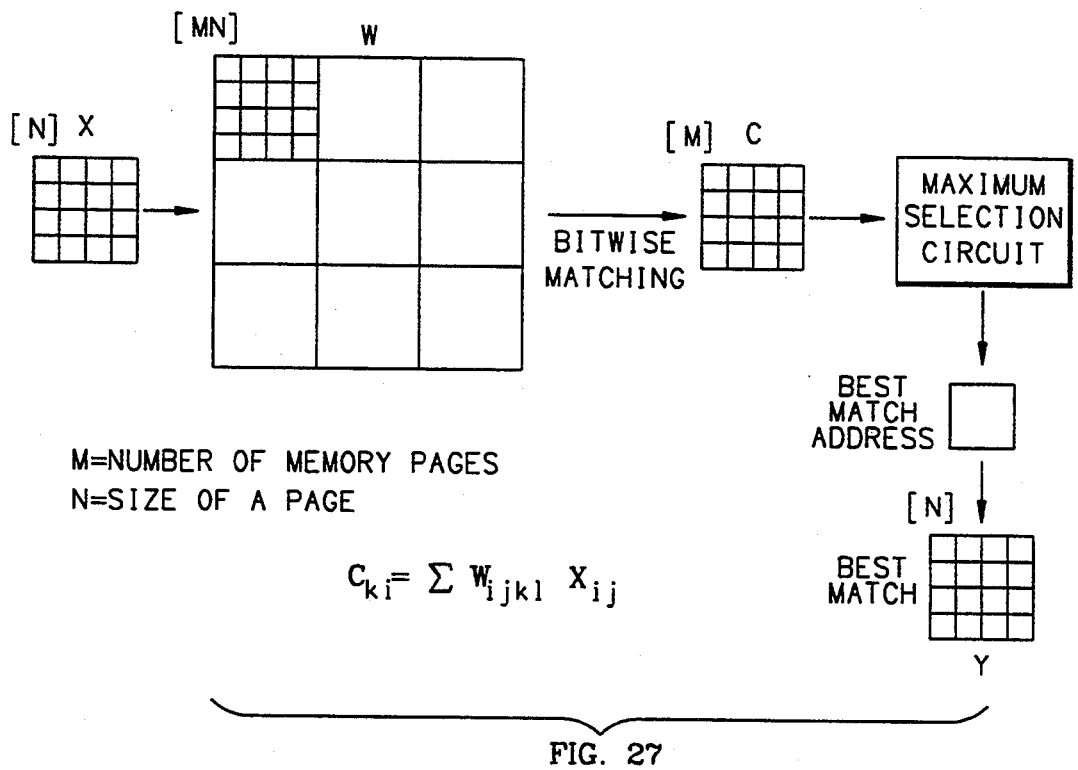
FIG. 27 is a diagrammatic representation of the performance in of a parallel inner-product algorithm for image matching in an Associative memory in accordance with the present invention.
Figure 28:
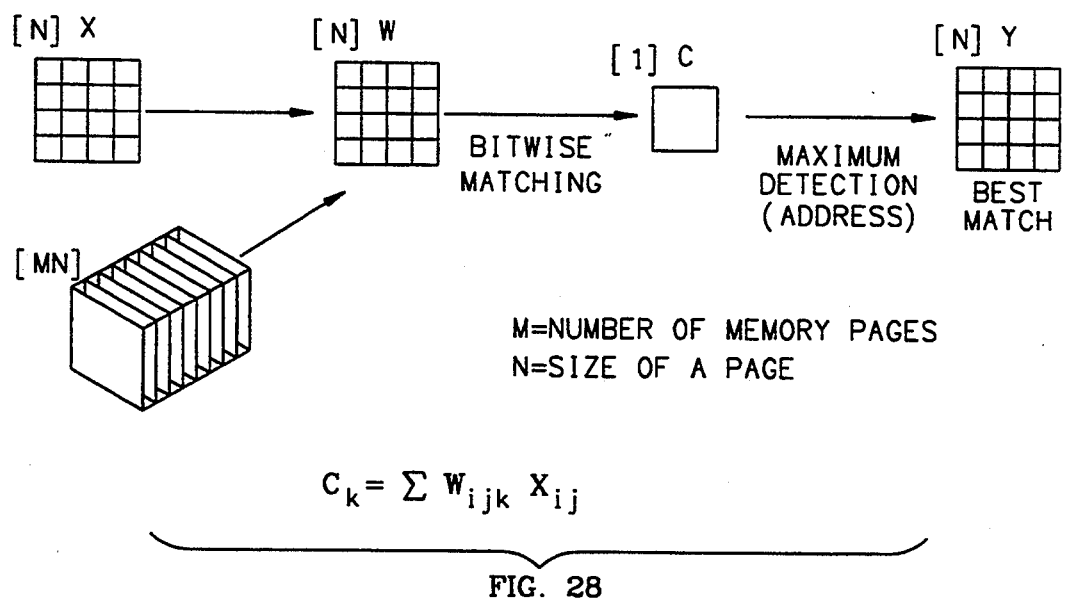
FIG. 28 is a diagrammatic representation of the performance in of a page-serial, bit-parallel inner-product algorithm for image matching in an Associative memory in accordance with the present invention.

The results of the simulation can be seen FIG. 24, consisting of FIG. 24a through FIG. 24c, where 16×16 pixel images were used. FIG. 24a is a diagrammatic representation of an arbitrary input query having the arrayed letters "RADC". FIG. 24a is a diagrammatic representation of a pixel-bit by pixel-bit output of the XNOR gates shown in FIGS. 21 and 23, which output shows a complete match with one image of the memory. FIG. 24a is a diagrammatic representation of the image recovered from the memory, namely the optical disk recorded with arrayed one-dimensional holograms that is read by the motionless readout head.

3. An Associative Memory in Accordance With the Present Invention

3.1. Use of Parallel-Accessed Optical Memories in an Associative Memory

In order to design an efficient associative memory system employing an optical memory store, each of the (i) size, (ii) data transfer bandwidth, (iii) latency time and (iv) access time characteristics of the optical store must be taken into account. The data transfer bandwidth is defined as the maximum rate of information transfer from the memory device. Latency time is defined as the delay between accessing two successive bit-planes. The retrieval time is defined as the time required to read the entire content of the memory.

Several optical memory stores have been proposed that transfer data in parallel in order to realize a high data transfer bandwidth. The characteristics of several different page-oriented parallel-access optical memories are shown in the Table 3 of FIG. 25. Three-dimensional (3-D) memories such as photo-refractive crystals and two-photon memories are discussed in the paper Three-Dimensional Optical Storage Memory by Parthenoupoulos and Rentzepis, Science, Aug. 25, 1989; in the paper Potentials of two-photon based 3-D optical memories for high performance computing to Hunter, et al., *Applied Optics*, May 10, 1990; in the paper Transient Spectroscopy of a Photochromic Fulgide to Parthenopoulos and Rentzepis, Journal of Molecular Structure for Winter, 1990, and in the papers regarding two-photon volume information storage in doped polymer systems. Planar memories—such as the Page-Oriented Holographic Memory (POHM)—are discussed by N. H. Farhat in *Advances in Holography*, Vol III, New York, Springer Verlag, 1977. Finally, the motionless-head parallel readout optical disk that is the subject of the related patent application is discussed by P. Marchand, A. Krishnamoorthy, P. Ambs, and S. Esener in the article "Optoelectronic Associative Recall using Motionless-head Parallel Readout Optical Disk," *Proc. SPIE* annual meeting, San Diego, Vol. 1347-10, pp. 86-97, July, 1990 (published January 1991); and again by P. Marchand, A. Krishnamoorthy, P. Ambs, J. Gresser, S. Esener, and S. H. Lee, in the paper "Design of a Motionless-head for Parallel Readout Optical Disk." *Proc. ECO4, Intl. Congress on Optical Science and Engineering*, March, 1991, The Hague, The Netherlands.

In accordance with the showing of Table 3 within FIG. 25, the POHM approach provides lower data rates. If moving parts are not used, then the system is limited by the resolution requirements of the optical system as well as the reduced effective aperture. Reference H. Kiemle "Considerations on holographic memories in the gigabyte region," *Appl. Opt.* Vol. 13, pp 803-807, April, 1974.

In the opinion of the inventors of the present invention, volume holography using photorefractive crystals shows promise (circa 1991). Reference D.C. Staebler "Coupled-wave analysis of holographic storage in LiNbo3," *Journal of Appl. Physics*, Vol. 43, pp 1042-1049, 1972.

By applying a voltage to increase the asymmetry between write times and erase times, and storing low efficiency holograms, terrabit storage may be possible. Reference J. E. Ford, Y. Taketomi, D. Bize, Y. Fainman, and S. H. Lee, "Multiplex holography in SBN:60 under applied field," submitted to *J. Opt. Soc. Am.-A*, September, 1991. However, as of 1991 important questions of fixation, optimal multiplexing methods, and crosstalk must be answered before such systems can be put to practice.

Other volume media such as the UCSD/UCI 2-photon memory also have excellent performance potentials. See S. Hunter, F. Kiamilev, S. C. Esener, D. A. Parthenopoulos, P. M. Rentzepis, "Potentials of two-photon based 3-D memories for high performance computing," *Appl. Opt.* Vol. 29, pp 2058-2066, May, 1990 (op cit). Reference also co-pending U.S. patent application Ser. No. 07/586,456 filed Sep. 21, 1990, to Rentzepis, et al. for a THREE-DIMENSIONAL OPTICAL MEMORY, the contents of which application are incorporated herein by reference. However, such memories may possibly not be successfully manufactured before the turn of the (21st) century.

Based on the Table 3 of FIG. 25, the motionless-head parallel readout system for optical disks described in the preceding sections 1 and 2 is seen to be well suited to current and near-term future needs for high performance secondary storage.

3.2 Associative Memory Algorithms

Several algorithmic approaches to associative memory using 2-D bit plane storage have been investigated. These fall into two broad categories. The first is an outer product algorithm using matrix-tensor multiplications. The second is an inner-product scheme based on bitwise-matching.

In outer-product based associative memory algorithms, the memories are distributively stored via an outer-product construction. If $X_m$ represents one of M two-dimensional images to be stored, and $Y_m$ the desired output, a fourth rank tensor W must be stored ($W = \Sigma_M Y_m X_m T$). For auto-associative memories, $Y_m = X_m$. Outputs are obtained by iteratively performing tensor-matrix multiplications on the input followed by thresholding. Reference Table 4 of FIG. 26.

In inner-product based algorithms such as the Hamming network, the data ($X_m$'s) are stored explicitly. Reference R. Lippmann, "An introduction to computing with neural nets", *IEEE ASSP Magazine*, pp. 4–22, April, 1987. Inner-products between the input and all the $X_m$'s are calculated and the output is the corresponding $Y_m$ associated with the largest inner-product. The inner products may be calculated in parallel (see FIG. 27), in which case a maximum selector network is needed, and the capacity of the associative memory is limited by the size of this network. Alternatively, inner-products may be calculated serially (FIG. 28), for each Xm, which does not require maximum selector network to be implemented in hardware.

Outer-product neural network algorithms such as the Hopfield network and its variants suffer several disadvantages when compared to parallel inner-product methods. Reference B. L. Montgomery and B. V. K. Vijaya Kumar, "Evaluation of the Hopfield neural network as a nearest neighbor algorithm," *Appl. Opt.*, Vol. 25, pp 3759–3766, October, 1986; and E. B. Baum, J. Moody and F. Wilczek, "Internal representations for associative memory," *Biol. Cybernetics*, Vol. 59, pp 217–228, 1988.

The critical issues for an optoelectronic implementation are the storage requirements, system complexity, search times, and fault tolerance of these methods. In Table 4 shown in FIG. 26 a comparison of outer-product, parallel inner-product, and serial inner-product methods is presented. Outer-product based associative memories can provide robust storage and fast convergence when a small number of very large memories are used. Reference J. Komlos and R. Paturi, "Convergence results in an associative memory," *Neural Networks*, Vol. 1, pp 239–250, 1988.

However, inner-product methods provide significant hardware savings when a large number of memories must be stored. For parallel-accessed optical storage devices such as the parallel-readout optical disk (M=14,000 images of N=128×128 bits each), the page-serial, bit-parallel method has the least storage requirements as well as the lowest system complexity because no maximum selector network is needed. For this same reason, the method does not place an upper limit on the number of memories that can be searched. The search time of this method (on the order of M, or O[M]) is higher than those of outer product methods and parallel inner product methods. But, due to the high data rate achievable with optical storage devices such as the parallel readout optical disk, this method can lead to a system with a high search rate when combined with an optoelectronic integrated circuit as described below. The ability to perform search operation algorithms can also be realized with the OEIC as described hereinafter. Finally, robustness to point defects can be traded in for memory capacity. For these reasons, the page serial, bit parallel inner product algorithm is well suited to implementation, using parallel-accessed optical storage devices such as the parallel readout optical disk.

3.3 Optoelectronic Associative Memory Design

The preferred embodiment of an associative memory system in accordance with the present invention—elsewhere discussed in A. V. Krishnamoorthy, P. Marchand, G. Yayla, and S. Esener, "Optoelectronic Associative Memory using a Parallel Readout Optical Disk," in Technical Digest OSA Annual Meeting '90, Paper MJ5, Boston, November, 1990 —consists of an optical storage device such as the parallel readout optical disk, a photo-detector array, and a silicon Optoelectronic Integrated Circuit (OEIC) with fast local XNOR circuitry (FIG. 21). This system achieves high (digital) accuracy associative search via an electronic tree-based fan-in structure, and high throughput since operations can be pipelined. In addition, the OEIC has a reconfigurable architecture which allows searches to be performed on variable-size sub-fields. This enables the system to be applied to a wide variety of database, low-level image processing and pattern recognition tasks including applications where the size of the sub-field must be dynamically varied.

The system operation is based on the page-serial, bit-parallel search method described above. A 2-D query from the host computer is electronically loaded onto the OEIC (FIG. 21). The query image is then compared serially to the binary images from the optical disk (bitwise XNOR matching operations). The outputs of the XNOR gates are summed and fed into a decision circuit which controls the data flow between the photo-detector array and the host computer.

The associative memory system can support at least three modes of operation.

In the first mode, a threshold value is preselected. All images (or sub-images) that are sufficiently close to the query are retrieved by the host computer via the photo-detector array.

The second mode finds the best match to the query image. On the first rotation, the Hamming distance detected for each image is input to the decision circuit (page-serial bit-parallel search). The best match is identified and retrieved on the subsequent rotation. The system can also be reconfigured to perform associative search for images of variable sizes while retaining the parallelism and high data rate provided by the optical storage medium.

The third mode of operation permits the associative memory system to be used as a classifier in pattern recognition applications. A query image, or sub-image, is compared to all images stored on the optical disk. If a "match" within a particular Hamming distance of separation is found then the query belongs to that particular class. In this mode of operation the photo-detector array is not needed.

The associative memory does not place an upper limit on the number of stored images it can have in its database. This enables the capacity of the associative memory to be traded in for search time by using several optical storage devices (in a jukebox fashion). The preferred embodiment of the associative memory has the advantage that no addressing mechanism is required for the optical storage medium. The associative memory cycles through all the images sequentially, in the order they were stored, and keeps track of them by using a counter. The maximum search rate is estimated to be better than $10^{10}$ bit-ops/sec using the custom-designed silicon OEIC described below.

3.4 Optoelectronic integrated circuit architecture

The OEIC consists of an array (128×128) of unit cells, each having a light detector and local Silicon circuitry that performs the Exclusive-NOR (or, alternatively, the Exclusive-OR) logic function. Each unit cell receives three inputs as well as control information. The query bit is electronically loaded from the host computer. The corresponding bit from the stored binary images arrives from the disk at the detector. The third input is a clock obtained from the disk that signals when a complete image is under observation.

The detector circuits of the optoelectronic XNOR gate array can be designed to provide large noise margins for the detected input bits. Thus the system can operate with images having low signal-to-noise ratios. The XNOR logic circuits produce a high output only when a bit-match occurs. (Alternatively, the alternative XOR logic circuits produce a high output only when a bit-mismatch occurs. Comparison via XNOR circuits is thus a measure of similarity while comparison via XOR circuits is a measure of dissimilarity.) The SNRs achievable with the disk holograms can therefore be tolerated since each detector circuit restores logic levels.

By inverting the detected bits of the disk before the XNOR circuits it is also possible to perform an associative search on the negative, or complement, of a stored image. A logic Exclusive-NOR comparison (XNOR) is directed to giving the degree of match between images. It may, under some circumstances, be equally applicable to discern the degree of mismatch between images (or sub-images). Such a determination of mismatch may be realized with logic Exclusive-OR (XOR) circuits. The principles of the present invention will be recognized to extend beyond the particular logic circuits, or the particular comparison algorithms, that are preferably used, and to broadly embrace the concept of an optically-encoded input signal that is detected and compared in a circuit that integrates both these functions.

Continuing with the operation of the associative memory, the outputs of the unit cells are then summed electronically using a tree fan-in structure. Each fan-in unit adds the inputs it receives and sends the result up the tree. The Hamming distance between the query image and a stored image is obtained in $Log_k N$ stages where k is the fan-in per stage. A diagrammatic representation of the tree-based OEIC architecture with k=2 is shown in FIG. 21. The operations transpiring within each stage of the tree are pipelined in order to increase the system throughput. The output of the final stage is fed to a decision/threshold circuit that determines the best matching image.

Figure 29A:
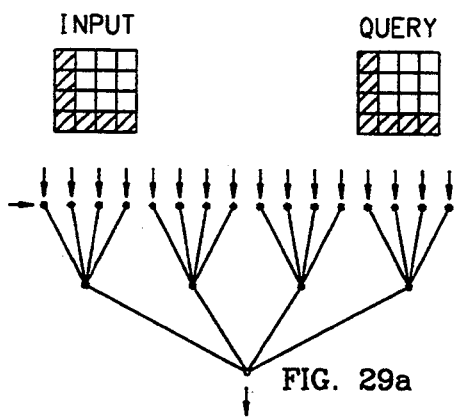
FIG. 29, consisting of FIG. 29a and FIG. 29b, is a diagrammatic representation of the principle of subfield searching using a tree-based architecture.
Figure 29B:
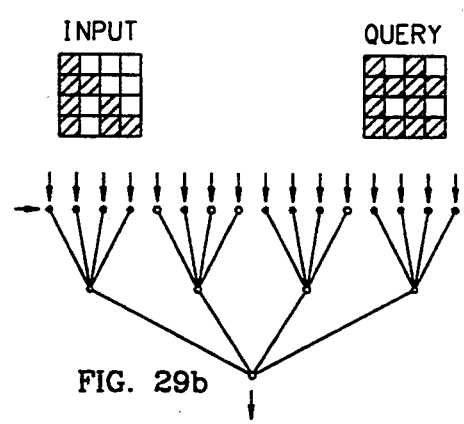

Search operations can also be performed on sub-images by incorporating additional thresholding circuitry at the fan-in nodes. The size of the subfield to be searched can be varied by enabling the fan-in units at the appropriate level of the tree to perform thresholding. Two diagrammatic representations of the principle of sub-field searching using a tree-based OEIC architecture with k=2 are shown in FIG. 29, consisting of FIG. 29a and FIG. 29b. For example, in FIG. 29, a threshold can be used in Stage 3 to recognize a particular 4×4 image. In this case the fan-in nodes in earlier stages are performing 1-bit additions. But, if threshold units are used in Stage 2, it becomes possible to search for a particular 2×2 image. In this case, fan-in units in higher levels (after thresholding) can be used either to count the number of matched sub-images or to find the best matching sub-image by addressing the individual fan-in nodes. Hence, it is possible to dynamically vary the field size of the search operation.

A diagrammatic representation of the OEIC architecture is shown in FIG. 23a, and a functional schematic of the fan-in unit functional unit incorporated therein is shown in FIG. 23b. An elementary fan-in unit consists of a simple adder. If thresholding is required then it becomes necessary to load and store the value of the threshold (theta), and to have a comparator at the fan-in unit. The ability to determine the location of the match is obtained by addressing the individual fan-in units. In addition, the ability to perform a correlation between the disk images and the query is achieved by electronically shifting the disk images between successive XNOR/summation operations. Therefore each fan-in unit is equipped with a counter which increments its value after each successive shift. Note that the number of shifts necessary is proportional to the size of the sub-image and is independent of the overall image size (since matching operations on sub-images are performed concurrently)- When the matching image (or sub-image) shifts into place, the threshold circuit produces a high output which then enables the counter to dump its current value into a memory buffer which is then output to a decoder circuit. The address of the active fan-in unit and the contents of the counter uniquely determine the size and position of the match. The number of matches is determined by the number of active fan-in units. It should be noted that the size (area) of an individual fan-in unit grows (linearly) as one approaches the root of the tree, but their number decreases (exponentially). For instance, for a 128×128 (16K) pixel OEIC, if the minimum field size to be searched is 8×8 pixels, then a total of only 1024 (1K) fan-in units require the added functionality described above. Based on a preliminary design of a 16×16 prototype, the estimated area of a full scale 128×128 OEIC is approximately 1.7 cm² and the estimated maximum performance is $10^{10}$ bit-operations/second (assuming an on-chip clock frequency of 100 Mhz).

3.5. Associative Memory System Emulation

Figure 30A:
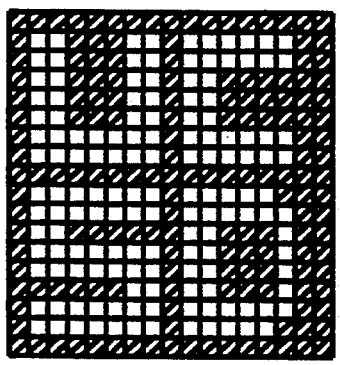
FIG. 30, consisting of FIG. 30a through FIG. 30c, is a plate showing "raw" 16×16 pixel images derived from the optical disk storage used in the associative memory of the present invention, and captured using a CCD camera.
Figure 30B:
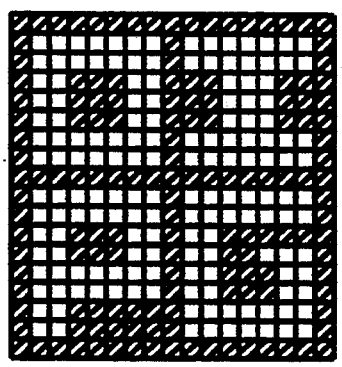
Figure 30C:
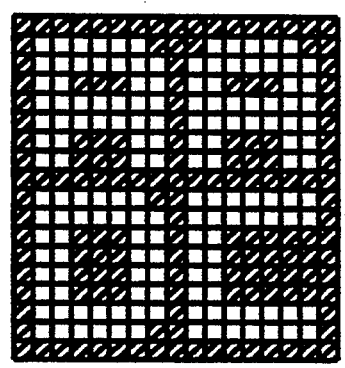
Figure 31A:
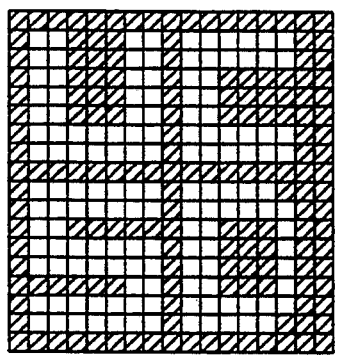
FIG. 31, consisting of FIG. 31a through FIG. 31c, is a plate showing corresponding 16×16 pixel images as are shown in FIG. 30 after thresholding and pixillation.
Figure 31B:
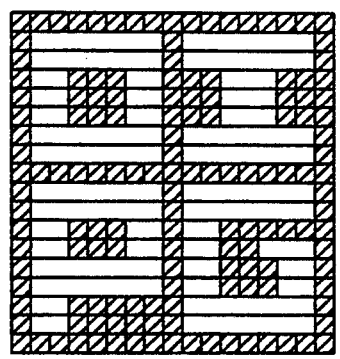
Figure 31C:
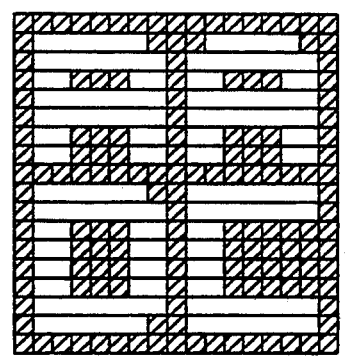

An experimental emulation of the optoelectronic associative memory system was recently performed. Three 16×16 images were retrieved from an experimental prototype of the disk. These images were scanned using a CCD camera and input to an IBM PC where the electronic functionality of the OEIC was simulated in 'C'. FIG. 30, consisting of FIG. 30a through FIG. 30b, shows the "raw" images captured by the CCD camera. Once an image is read, it is first thresholded and pixillated. The results of these processes are diagrammatically illustrated in FIG. 31, consisting of FIGS. 31a–31c corresponding to FIGS. 30a–30c.

Figure 32A:
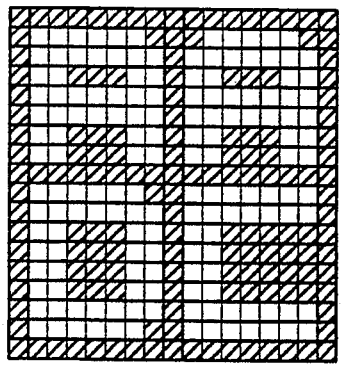
FIG. 32, consisting of FIG. 32a through FIG. 32c, is a plate showing three images that are respectively a query ("RADC"), the output of XNOR gates indicating a perfect match with an image within optical memory, and that retrieved image ("RADC"), developed during operation of the associative memory of the present invention.
Figure 32B:
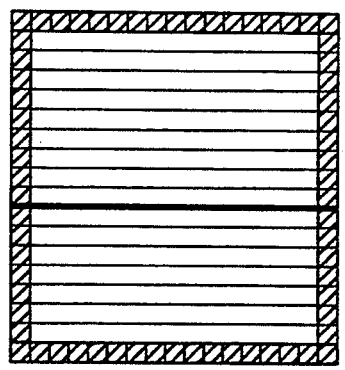
Figure 32C:
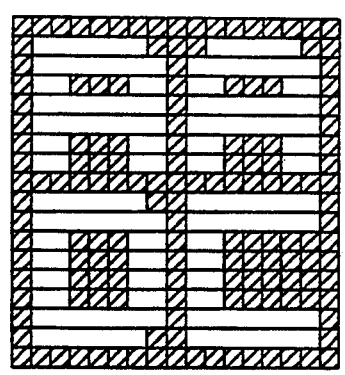

The basic operation of the associative memory in the comparison of images is shown in FIGS. 32-34. FIG. 32a shows a query input (in this case an arbitrary image of the arrayed letters "RADC"). The query is then matched with all the stored images. A perfect match (of 256 pixels) is found, as illustrated by the arrayed outputs of the XNOR gates in FIG. 32b. The appropriate matched image (of "RADC") is retrieved on the next cycle, as is shown in FIG. 32c.

Figure 33A:
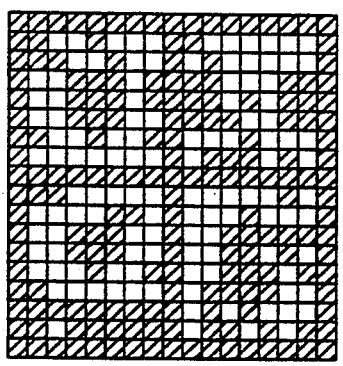
FIG. 33, consisting of FIG. 33a through FIG. 33c, is a plate showing three images that are respectively a query with 20% added noise ("OIPG"), the output of XNOR gates for a best match with an image within optical memory (220 pixel match), and that retrieved image ("OIPG"), developed during operation of the associative memory of the present invention.
Figure 33B:
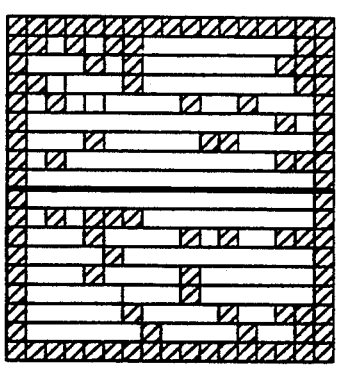
Figure 33C:
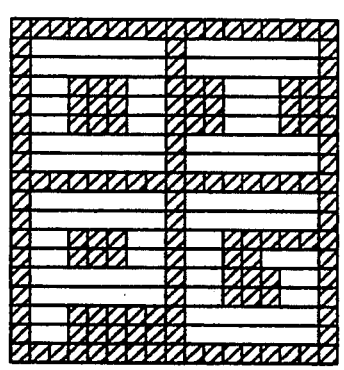
Figure 34A:
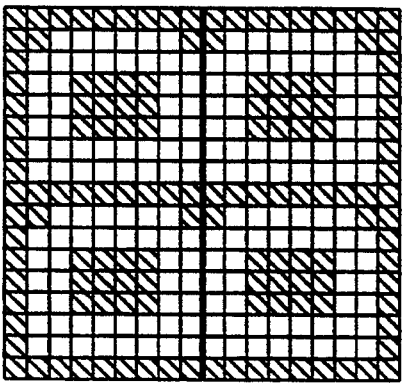
FIG. 34, consisting of FIG. 34a through FIG. 34g, is a plate showing seven images that are respectively a query (an array of four "D's"), two outputs of the XNOR gates for two best matches with an image within optical memory, the number and location of the matches (a perfect match on the lower right corner of "UCSD" and the lower left corner of "RADC"), and two retrieved images ("UCSD" and "RADC"), developed during operation of the associative memory of the present invention.
Figure 34B:
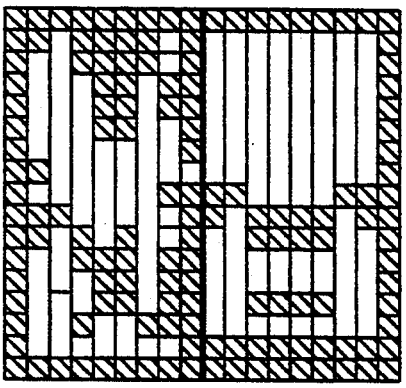
Figure 34C:
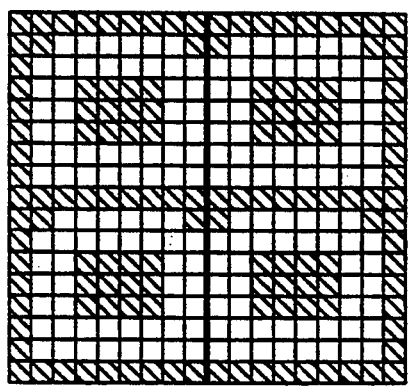
Figure 34D:
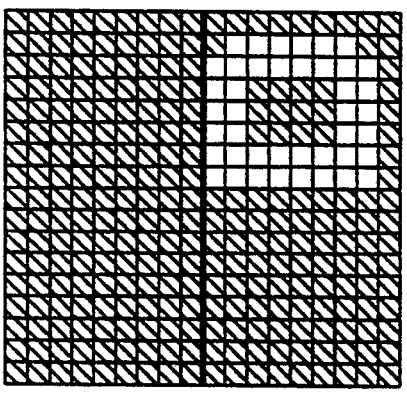
Figure 34E:
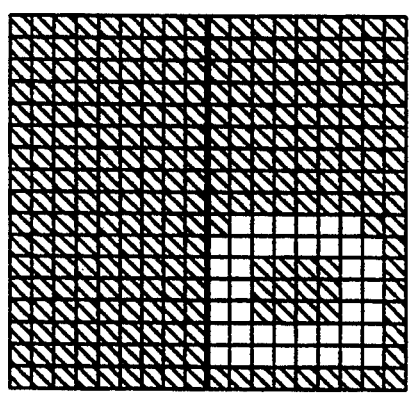
Figure 34F:
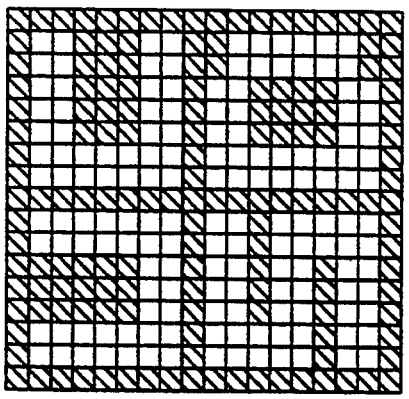
Figure 34G:
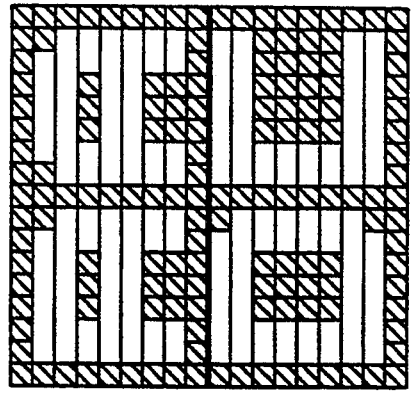

In FIG. 33—consisting of FIG. 33a through FIG. 33c—the query is now a distorted image of the arrayed arbitrary letters "OIPG" with 20% noise added. The best matching image has an overlap of 220 pixels, permitting the correct image ("OIPG") to be retrieved.

FIG. 34—consisting of FIGS. 34a through FIG. 34g—demonstrates sub-field search. The query is an 8×8 image of the letter "D". The purpose of the search is to retrieve all images that contain a "D" and to pinpoint their location within the image. The 8×8 query is first replicated four times to obtain a 16×16 query image. This image is then compared to the stored images on the disk. Results for the (arbitrary) stored images "UCSD" and "RADC" are shown in FIG. 34. The results correctly indicate that there is a "D" present at the lower right corner of the image "UCSD", and the lower left corner of the image "RADC". These images of "UCSD" and "RADC" are retrieved from the disk.

In this manner, high-speed recall based on distorted or partial cues can be achieved. The ability of the system of the present invention to so perform is based on the parallel nature of the optoelectronic system.

Figure 42:
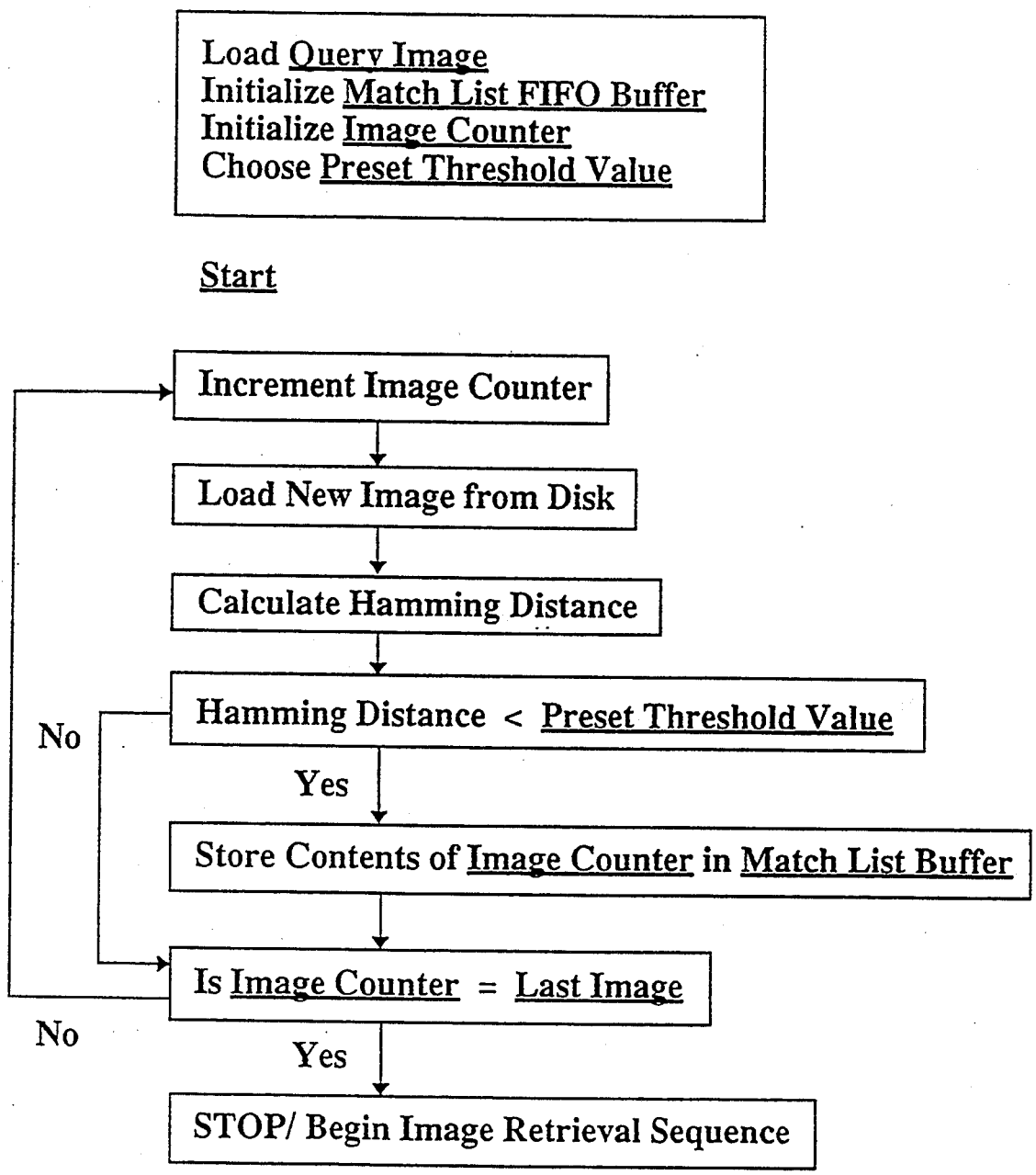
FIG. 42 is a flow diagram of the operation of the associative memory in accordance with the present invention in its performance of a first function of a preset threshold search.
Figure 43:
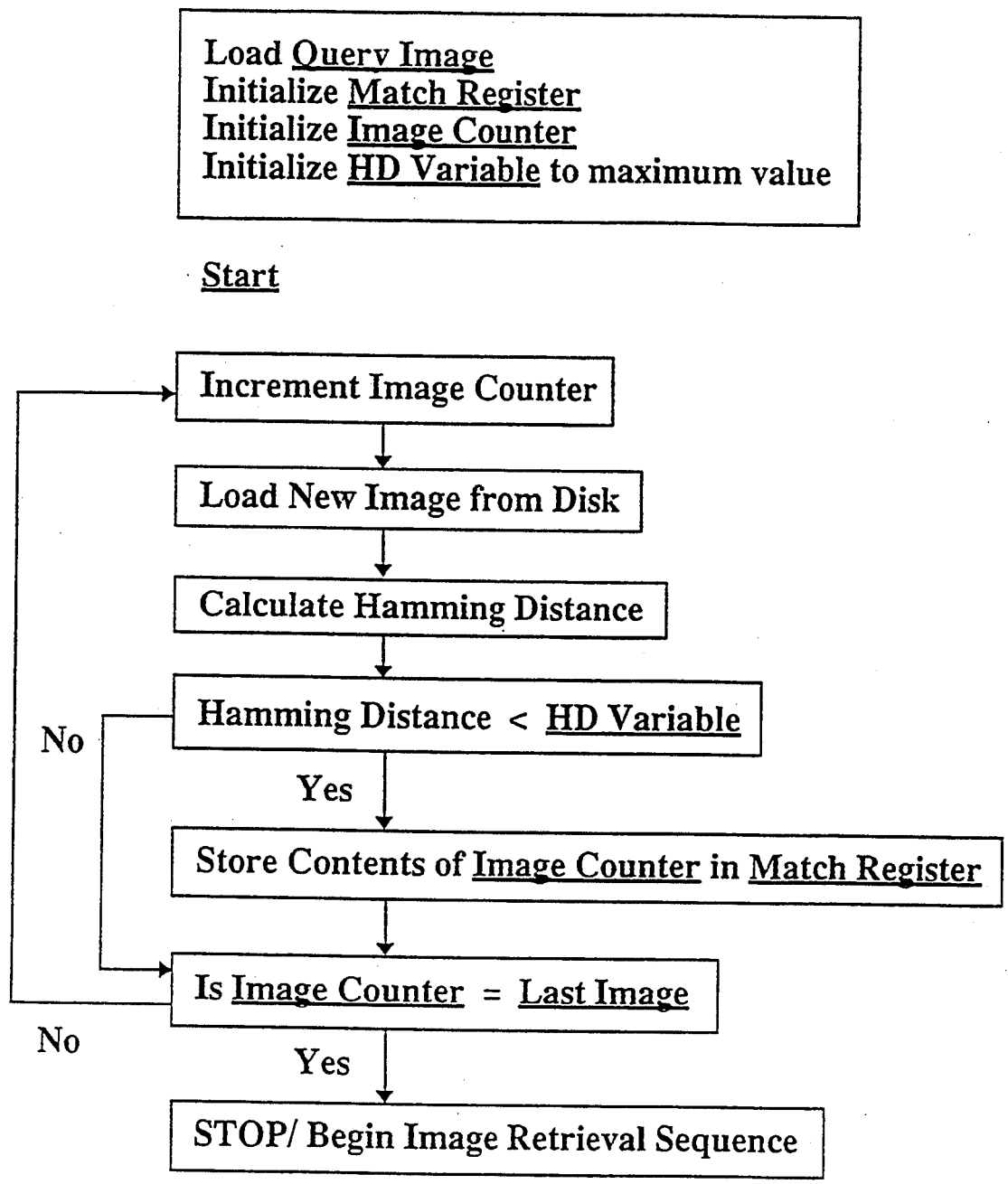
FIG. 43 is a flow diagram of the operation of the associative memory in accordance with the present invention in its performance of a second function of a best match search.
Figure 44:
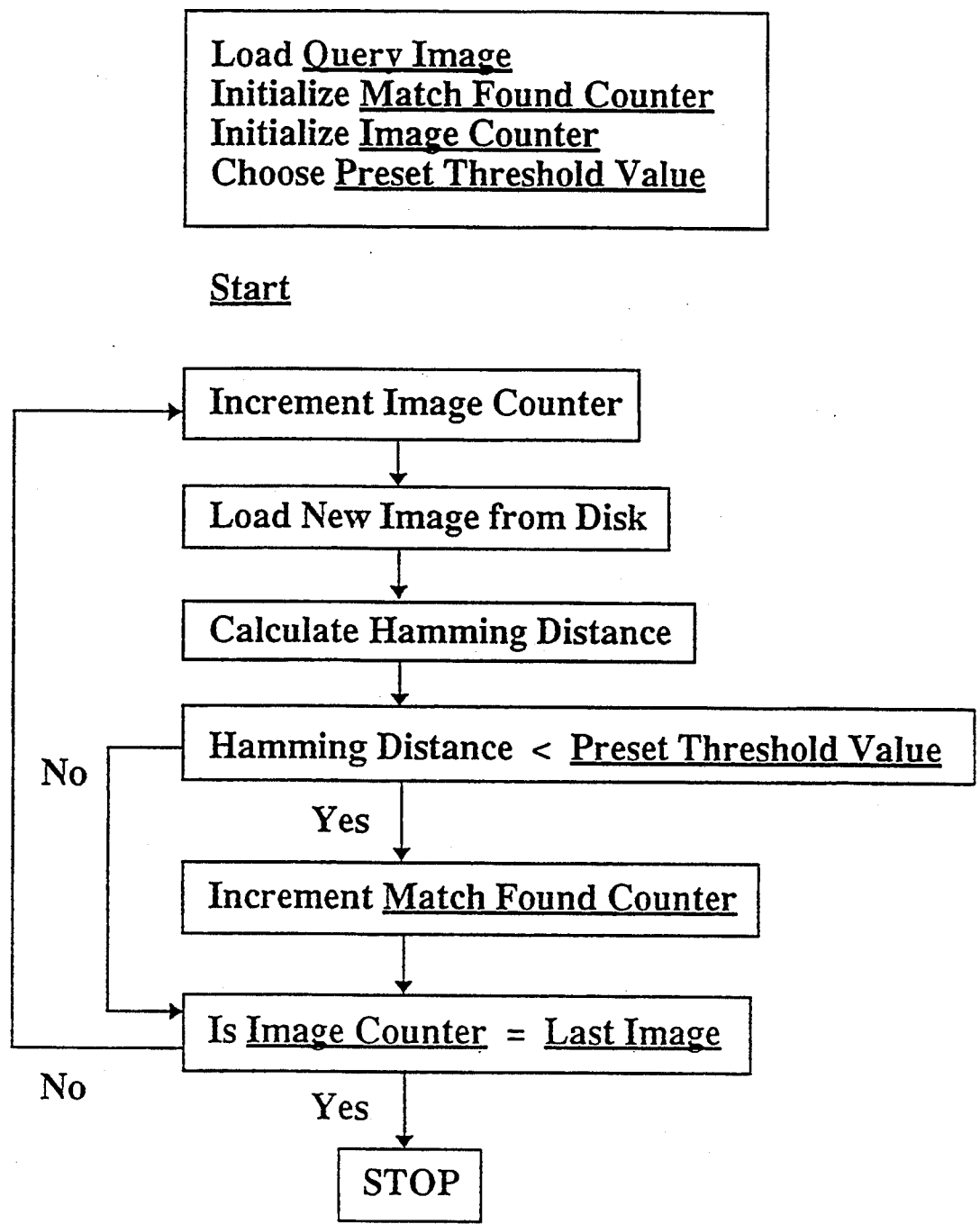
FIG. 44 is a flow diagram of the operation of the associative memory in accordance with the present invention in its performance of a third function of a classification/match detection.

3.6 Detail Construction of a Preferred Embodiment of the Optoelectronic Integrated Circuit A second (after FIG. 23a) pictorial representation of the optoelectronic integrated circuit of the present invention is shown in expanded scale in FIG. 35. The functional schematics of the circuit elements from which the OEIC is built are shown in FIG. 36-41. Detail flow diagrams of the arithmetic and logic functions implemented by the circuitry of the optoelectronic integrated circuit are shown in FIGS. 42-44.

The OEIC processes a maximum image size of N×N pixels, nominally 128×128 pixels. The minimum subfield size for image comparison is M×m pixels, nominally 16×16 pixels. (The subfield need not be square, but is typically an integer fraction of the full field.) The number of stages within the binary tree of the OEIC equals $Log_k$ N, or when k=2 as is preferred $Log_2$ N. When N equals 128 then the number of stages equals 7. The number of XNOR leaf units equals 2 Log N, or typically 14 such units. The number of stages having adders and no threshold capability equals 2 Log N, and is again typically 14. The number of stages having adders and a threshold capability is 2 Log N−2 Log M, and is typically 7−4=3.

FIG. 36a shows a diagram of a symbol for the function of a leaf node optical detector and XNOR gate used in the OEIC. FIG. 36b shows an functional flow diagram of this leaf node optical detector and XNOR gate.

Figure 37A:
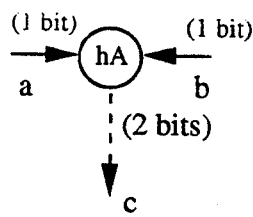
FIG. 37, consisting of FIG. 37a and FIG. 37b, is a diagram of a symbol, and of a flow diagram, for the function of a half adder used in the optoelectronic integrated circuit used in the associative memory in accordance with the present invention.
Figure 37B:
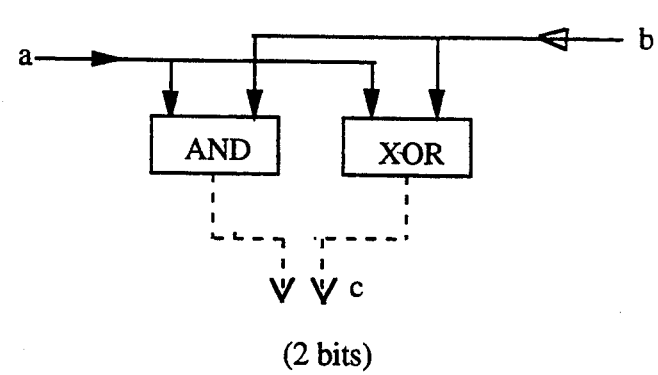

FIG. 37a shows a diagram of a symbol for the function of a half adder used in the OEIC. FIG. 36b shows an functional flow diagram of this half adder.

Figure 38:
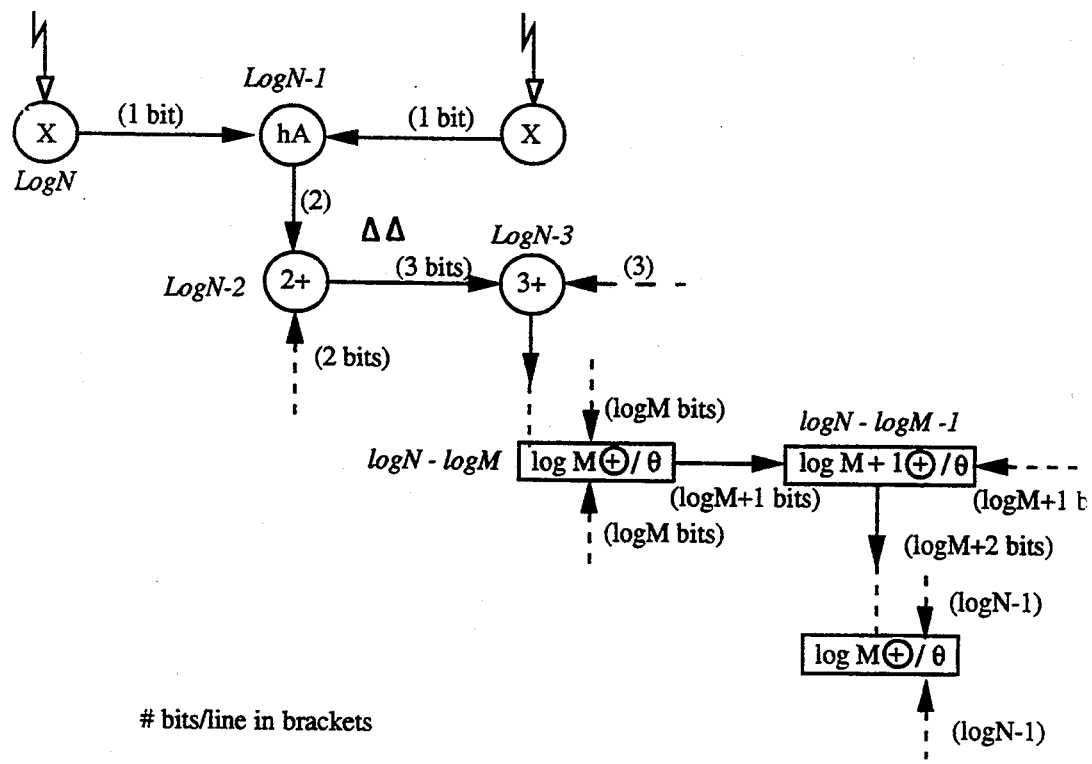
FIG. 38 is a functional schematic showing the basic architecture of the OEIC, which architecture permits all three modes of operation on a complete (full) image.

FIG. 38 is a functional schematic of the basic architecture of the OEIC, which architecture permits all three modes of operation on a complete (full) image.

Figure 39:
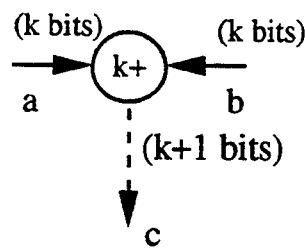
FIG. 39 is a combination symbol and flow diagram of the k-bit summation unit used in the optoelectronic integrated circuit used in the associative memory in accordance with the present invention.

FIG. 39 shows both the symbol, and the functional flow diagram, of the k-bit summation unit used in the optoelectronic integrated circuit.

Figure 40A:
FIG. 40, consisting of FIG. 40a and FIG. 40b, is a diagram of a symbol, and of a flow diagram, for the function of a 2-bit full adder used in the optoelectronic integrated circuit used in the associative memory in accordance with the present invention.
Figure 40B:
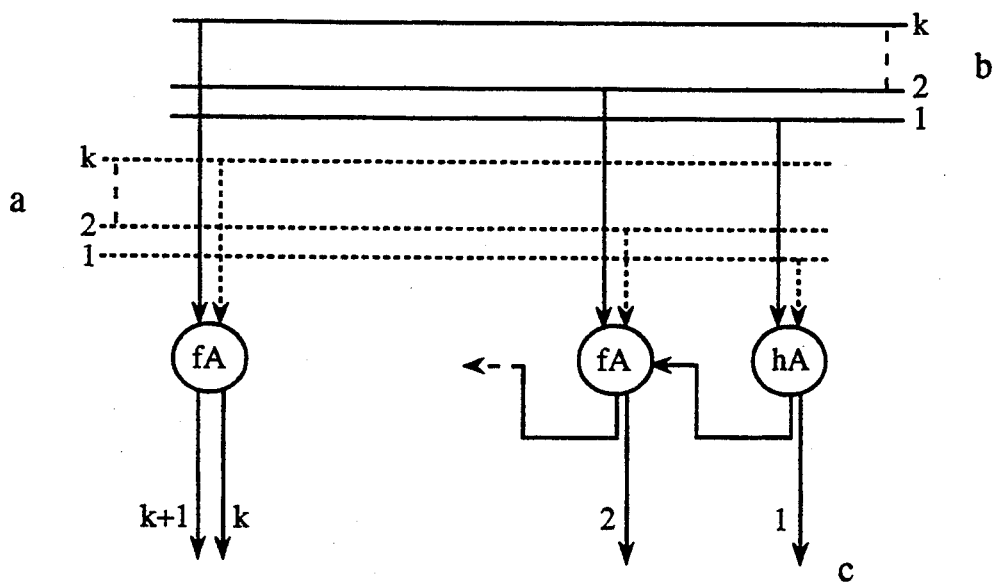

FIG. 40a shows a diagram of a symbol for the function of a 2-bit full adder used in the OEIC. FIG. 36b shows an functional flow diagram of this 2-bit full adder.

Figure 41A:
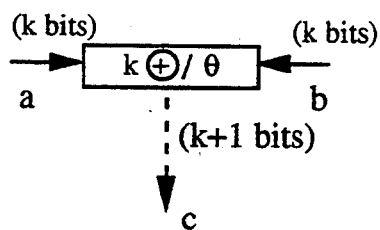
FIG. 41, consisting of FIG. 41a and FIG. 41b, is a diagram of a symbol, and of a flow diagram, for the function of a k-bit summation and (k+1)-bit comparison unit used in the optoelectronic integrated circuit used in the associative memory in accordance with the present invention.
Figure 41B:
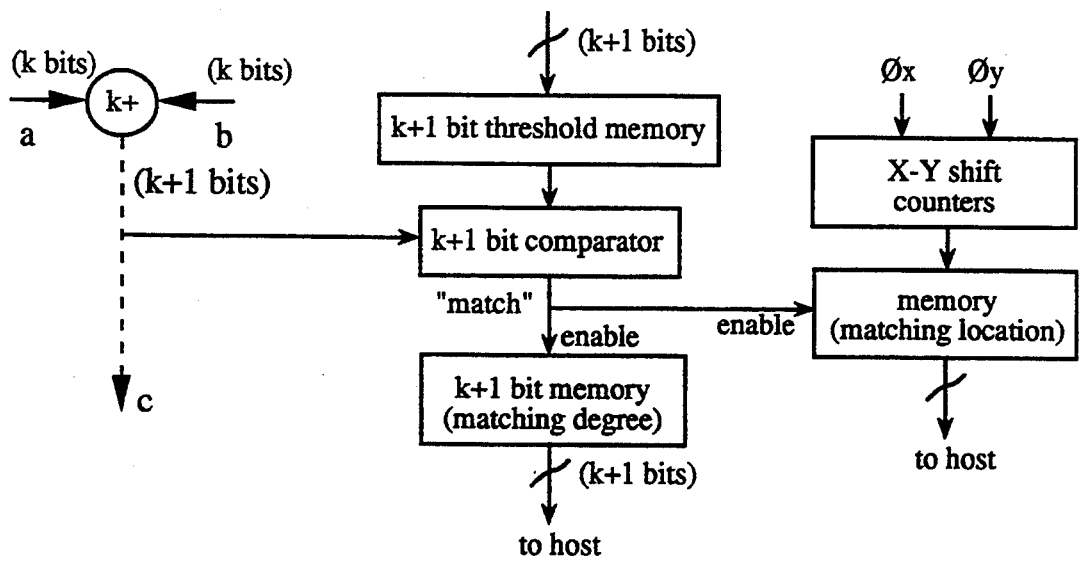

FIG. 41a shows a diagram of a symbol for the function of a k-bit summation and (k+1)-bit comparison unit used in the OEIC. FIG. 41b shows an functional flow diagram of this k-bit summation and (k+1)-bit comparison unit. The illustrated functional flow additionally permits that the OEIC should perform all three modes of its operation on a partial image.

A flow diagram of the operation of the associative memory in accordance with the present invention in its performance of a first function of a preset threshold search is shown in FIG. 42.

A flow diagram of the operation of the associative memory in accordance with the present invention in its performance of a second function of a best match search is shown in FIG. 43.

Finally, a flow diagram of the operation of the associative memory in accordance with the present invention in its performance of a third function of a classification/match detection is shown in FIG. 44.

Figure 45:
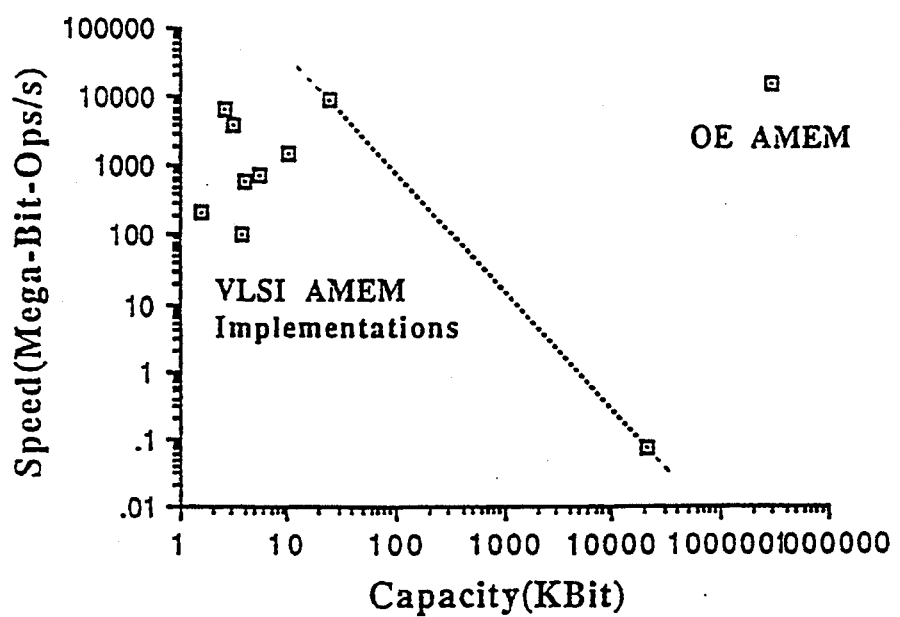
FIG. 45 is a graph showing the performance of an optoelectronic associative memory in accordance with the present invention versus previous fully electronic associative memory systems.

FIG. 45 is a graph showing the performance of an optoelectronic associative memory in accordance with the present invention versus previous fully electronic associative memory systems. The optoelectronic associative memory of the present invention typically advances each of the data transfer bandwidth by greater than two orders of magnitude ($>10^2$) over previous, semiconductor-based, associative memories. The storage capacity is typically advanced by greater than several orders of magnitude ($>10^3$). Finally, the bit-operations per second of its associative determinations is typically advanced by greater than two orders of magnitude ($>10^2$).

4. Summary

The present invention is embodied in a high performance optoelectronic associative memory. The memory achieves associative recall on 2-D bit-plane oriented storage media. The memory is implemented with existing parallel-accessed optical storage devices (e.g. optical disk) and silicon VLSI technology, permitting an implementation with presently-available, and proven, technology.

The associative memory combines a high bandwidth parallel-readout optical storage device with a custom-designed VLSI-based optoelectronic integrated circuit. When used in conjunction with the motionless-head parallel readout optical disk FIG. 1), the associative memory can achieve a capacity of over 1 Gbit and a maximum processing speed of $10^{10}$ bit-operations/second.

The associative memory can be dynamically reconfigured to search for images of different sizes. The optical storage device in which the images are stored has the advantage that no addressing is required for the stored images. The system does not impose an upper limit on the number of images that may be searched.

Finally, the associative memory's preferred optoelectronic chip can be designed to process images having low signal-to-noise ratios. An emulation of the associative memory using 16×16 images was performed to verify system operation.

In accordance with the preceding discussion and accompanying remarks, the present invention should be conceived broadly, and in accordance with the following claims only, and not solely in terms of those particular embodiments within which the invention has been taught.

What is claimed is:

1. An optoelectronic associative memory comprising:
   an optical storage means for producing an optically-encoded first word having a multiplicity of bits encoded in parallel upon a light beam;
   a multiplicity of light detector means, responsive to the light beam, operative in parallel for producing a first multiplicity of electrical signals corresponding to the multiplicity of parallel-encoded bits in the optically-encoded first word;
   an electrical query means for producing a second word having a multiplicity of bits electrically-encoded as a second multiplicity of electrical signals;
   comparator means, receiving the first and the second multiplicities of electrical signals, for comparing the first and the second multiplicities of electrical signals in order to determine the correspondence between the optically-encoded first word and the electrically-encoded second word.

2. The optoelectronic associative memory according to claim 1
   wherein the optical storage means is producing a binary optically-encoded first word;
   wherein the electrical query means is producing a binary electrically-encoded second word;
   and wherein the comparator means comprises:
   a multiplicity of XNOR means each for performing a logic Exclusive NOR comparison between a corresponding one of the first and of the second multiplicities of electrical signals; and
   summation means for summing the comparisons of the multiplicity of XNOR means.

3. The optoelectronic associative memory according to claim 2 wherein the multiplicity of XNOR means are pipelined in operation.

4. The optoelectronic associative memory according to claim 1 further comprising:
   threshold means for supplying a predetermined threshold level of correspondence;
   and wherein the comparator means comprises:
   threshold comparison means, receiving the predetermined threshold level from the threshold means, for comparing the first and the second multiplicities of electrical signals in order to determine that the optically-encoded word is either within, or without, the threshold level of correspondence to the electrically-encoded word.

5. The optoelectronic associative memory according to claim 4 wherein the threshold means comprises:
   an electrical register variably presettable with the threshold level of correspondence.

6. The optoelectronic associative memory according to claim 2 wherein the comparator means comprises:
   a plurality of sub-comparator means each for determining that corresponding portions of the optically-encoded word and of the electrically-encoded word are individually either within, or without, the threshold level of correspondence.

7. The optoelectronic associative memory according to claim 6 wherein the plurality of sub-comparator means are operative in parallel.

8. The optoelectronic associative memory according to claim 6 further comprising:
 means for counting the numbers of corresponding portions of the electrically-encoded word and of the optically-encoded word that are within the threshold level of correspondence.

9. The optoelectronic associative memory according to claim 1 wherein the comparator means comprises:
 comparison means for calculating the Hamming distance of comparison between the optically-encoded word and the electrically-encoded word.

10. The optoelectronic associative memory according to claim 9 wherein the comparison means comprises:
 a plurality of sub-comparison means each for calculating the Hamming distance of comparison between corresponding portions of the optically-encoded word and of the electrically-encoded word.

11. The optoelectronic associative memory according to claim 9 wherein the plurality of sub-comparison means are operative in parallel.

12. The optoelectronic associative memory according to claim 10 further comprising:
 means responsive to the calculations of the plurality of sub-comparison means for determining the one or more corresponding portions of the optically-encoded word and the electrically-encoded word that are most closely correspondent.

13. The optoelectronic associative memory according to claim 1 wherein the optical storage means comprises:
 a parallel readout optical disk system for producing at a multiplicity of times a multiplicity of optically-encoded words.

14. The optoelectronic associative memory according to claim 13 wherein the parallel readout optical disk system comprises:
 an optical disk having an active surface encoded with a multiplicity of data blocks each of which is in the form of a one-dimensional hologram, each plurality of data blocks that in combination represent one word being positionally distributed, and positionally shifted one to the next, radially along the disk's active surface to fit a complete radius;
 means for simultaneously illuminating the encoded optical disk along a radius within which the plurality of holographic data blocks constituting one word are fitted;
 optical transform means responsive to the illuminated plurality of holographic data blocks for transforming the combined holographic images into a light beam upon which the word is encoded in parallel.

15. The optoelectronic associative memory according to claim 14 wherein the optical disk is encoded with one-dimensional Fourier transform holograms.

16. The optoelectronic associative memory according to claim 1 wherein the optical storage means comprises:
 an optical disk.

17. The optoelectronic associative memory according to claim 16 wherein the optical disk stores the optically-encoded word as a one-dimensional hologram.

18. The optoelectronic associative memory according to claim 1 wherein the multiplicity of light detector means and the electrical comparator means are at least in part located in physical proximity upon the same substrate.

19. The optoelectronic associative memory according to claim 1 wherein the electrical comparator means comprises:
 electrical circuitry performing the Exclusive-NOR logic function.

20. An optoelectronic associative memory comprising:
 a parallel readout optical for reading out at one time an first word having a multiplicity of optically-binary-encoded bits;
 a multiplicity of photo-detectors operative in parallel to produce a first multiplicity of electrical signals in response to the multiplicity of optically-binary-encoded bits in the first word;
 a query means for producing a second word having a multiplicity of bits electrically-binary-encoded as a second multiplicity of electrical signals;
 XNOR means, receiving the first and the second multiplicities of electrical signals, for performing a logic Exclusive OR comparison between corresponding ones of the first and the second multiplicities of electrical signals in order to determine, by the ones of such signals that match, the correspondence between the bits of the optically-encoded word and the electrically-encoded word.

21. The optoelectronic associative memory according to claim 20 further comprising:
 summation means for summing the determinations of the XNOR means in order to determine, by the summary number of signals that are determined to match, the degree of correspondence between the optically-encoded word and the electrically-encoded word.

22. The optoelectronic associative memory according to claim 21 wherein the XNOR means, and the summation means, are at least partially pipelined in operation, at least partially pipelined meaning that the XNOR means and the summation means are both simultaneously operative during at least some of the time that they are so operative.

23. The optoelectronic associative memory according to claim 21 wherein the XNOR means and the summation means are fully pipelined in operation, fully pipelined meaning that the XNOR means and the summation means are simultaneously operative to the duration of a shortest operational period of either the XNOR means or the summation means.

24. The optoelectronic associative memory according to claim 21 wherein the XNOR means comprises:
 multiple pluralities of XNOR circuits each of which pluralities performs a logic Exclusive OR comparison between a selective number of corresponding ones of the first and the second multiplicities of electrical signals;
 and wherein the summation means comprises:
 a multiplicity of adders structured in a binary tree receiving in a plurality of adders at each stage of the tree the determinations of the multiple pluralities of XNOR circuits.

25. A method of associating information in the form of images comprising:
 first producing in an optical memory an optically-encoded first image having a multiplicity of bits encoded in parallel upon a light beam;

receiving in parallel in a multiplicity of light detector means the multiplicity of bits encoded in parallel upon a light beam, and, responsively to the receiving, second producing a first multiplicity of electrical signals corresponding to this multiplicity of parallel-encoded bits in the optically-encoded first image;

third producing in an electrical query-producing circuit a second image having a multiplicity of bits electrically-encoded as a second multiplicity of electrical signals;

comparing, in an electrical comparator receiving the first and the second multiplicities of electrical signals, the first and the second multiplicities of electrical signals in order to determine the correspondence between the optically-encoded first image and the electrically-encoded second image.

26. The method of associating information according to claim 25 wherein the first producing, the receiving and second producing, the third producing, and the comparing are performed cyclically continuously.

27. The method of associating information according to claim 26 further wherein the third-produced query second image is held constant for a multiplicity of cycles.

28. The method of associating information according to claim 27 further comprising:

determining those one or ones of the optically-encoded first images that, as the result of the cyclically performed comparing, are in closest correspondence to the constant query second image.

29. The method of associating information according to claim 29 further comprising:

retrieving into electrically-encoded form those one or ones of the optically-encoded first images that are, as a result of the determining, are found to be in closest correspondence to the constant query second image.

30. The method of associating information according to claim 28 wherein the determining is of those one or ones of the optically-encoded first images that have the least Hamming distance of separation from the constant query second image.

31. The method of associating information according to claim 30 further comprising:

outputting the least Hamming distance of separation that is found as the result of the determining.

32. The method of associating information according to claim 30 further comprising:

retrieving into electrically-encoded form those one or ones of the optically-encoded first images that have the least Hamming distance of separation as is found as the result of the determining.

33. The method of associating information according to claim 26 further comprising:

predetermining a Hamming distance of separation; and determining those one or ones of the optically-encoded first images that, as the result of the cyclically performed comparing, are in within the predetermined Hamming distance of separation to the constant query second image.

34. The method of associating information according to claim 33 further comprising:

retrieving into electrically-encoded form those one or ones of the optically-encoded first images that are within the predetermined Hamming distance of separation as is found as the result of the determining.

35. The method of associating information according to claim 26 further comprising:

predetermining a Hamming distance of separation;

classifying each of a multiplicity of first images into a plurality of classification groups;

determining those one or ones of the optically-encoded first images that, as the result of the cyclically performed comparing, are in within the predetermined Hamming distance of separation to the constant query second image; and outputting the identity of all classification groups within which groups an optically-encoded first image is found, as a result of the determining, to be within the predetermined Hamming distance of separation to the constant query second image.

36. The method of associating information according to claim 35 further comprising:

retrieving into electrically-encoded form those one or ones of the optically-encoded first images that are within the predetermined Hamming distance of separation as is found as the result of the determining.

37. A method of associating information in the form of images comprising:

first producing in an optical memory an image as a multiplicity of bits optically-encoded in parallel upon a light beam;

receiving in parallel in a multiplicity of light detector means the multiplicity of bits optically-encoded in parallel upon the light beam, and, responsively to the receiving, second producing a multiplicity of electrical signals corresponding to the optically-encoded multiplicity of bits;

third producing in an electrical query-producing circuit a second sub-image as a plurality of electrical signals;

comparing in a comparator receiving the multiplicity of second-produced electrical signals and the plurality of third-produced electrical signals, the received second plurality of electrical signals to successive pluralities of the received multiplicity of electrical signals, one plurality after the next;

wherein the comparing serves to determine correspondence between a portion of the optically-encoded image and the electrically-encoded sub-image.

38. An optoelectronic associative memory comprising:

an optical storage means for producing an optically-encoded first word;

light detector means responsive to the optically-encoded first word for converting the optically-encoded first word into first electrical signal representative of the first word;

an electrical query source means for providing second electrical signal that electrically-encode a second word;

a comparator means, located on a same physical substrate as the light detector means, for comparing the first and the second electrical signals in order to determine the correspondence between the optically-encoded first word and the electrically-encoded second word.

39. An optoelectronic associative memory comprising:

an optical storage means for producing successive multiplicities of optically-encoded first data bits;

a light detector means successively receiving each of the successive multiplicities of optically-encoded first data bits for producing responsively thereto successive multiplicities of electrically-encoded first data bits;

a source of an electrically-encoded multiplicity of second data bits;

a comparator means, receiving the successive multiplicities of electrically-encoded first data bits from the light detector means and the electrically-encoded multiplicity of second data bits from the source, for comparing each successive multiplicity of first data bits to the multiplicity of second data bits in order to determine which particular multiplicity of first data bits, out of all the successive multiplicities of first data bits, most closely corresponds to the multiplicity of second data bits.

40. The optoelectronic associative memory according to claim 39 wherein the optical storage means produces each successive multiplicity of optically-encoded first data bits all at the same time in parallel;

wherein the light detector means successively receives each successive multiplicity of optically-encoded first data bits all at the same time in parallel, and produces responsively thereto each successive multiplicity of electrically-encoded first data bits all at the same time, in parallel; and wherein the comparator means comprises:

a massively-parallel multi-stage deeply-pipelined circuit receiving each successive multiplicity of electrically-encoded first data bits from the light detector means all at the same time in parallel, and comparing each successive multiplicity of first data bits to the multiplicity of second data bits in and through a plurality of successively performed comparisons accomplished in a plurality of pipelined comparison stages so as to determine, as the output of the pipeline on a last such comparison stage, the particular multiplicity of first data bits, out of the all the successive multiplicities of first data bits, that most closely corresponds to the multiplicity of second data bits.

41. An optoelectronic associative memory comprising:

an optical storage means for producing upon successive times, all at the same time an in parallel upon each such time, a multiplicity of data bits optically-encoded in parallel upon a light beam;

a multiplicity of light detector means, responsive to the light beam, operative in parallel for producing in parallel upon each of the successive times a multiplicity of electrical signals corresponding to the multiplicity of data bits;

comparator means, receiving upon each of the successive times the multiplicity of electrical signals, for comparing in parallel upon and during each of the successive times the multiplicity of the received electrical signals to a predetermined pattern in order to determine the correspondence between the data bits to which the received electrical signals correspond and the predetermined pattern.

* * * * *